US010325940B2

(12) United States Patent
Takayama et al.

(10) Patent No.: US 10,325,940 B2
(45) Date of Patent: Jun. 18, 2019

(54) VEHICLE, DISPLAY DEVICE AND MANUFACTURING METHOD FOR A SEMICONDUCTOR DEVICE

(71) Applicant: SEMICONDUCTOR ENERGY LABORATORY CO., LTD., Atsugi-shi, Kanagawa-ken (JP)

(72) Inventors: Toru Takayama, Kanagawa (JP); Junya Maruyama, Kanagawa (JP); Yuugo Goto, Kanagawa (JP); Hideaki Kuwabara, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/347,967

(22) Filed: Nov. 10, 2016

(65) Prior Publication Data

US 2017/0125454 A1 May 4, 2017

Related U.S. Application Data

(60) Continuation of application No. 14/457,140, filed on Aug. 12, 2014, now Pat. No. 9,493,119, which is a (Continued)

(30) Foreign Application Priority Data

Nov. 30, 2001 (JP) .................................. 2001-367412

(51) Int. Cl.
*H01L 21/00* (2006.01)
*H01L 27/12* (2006.01)
(Continued)

(52) U.S. Cl.
CPC ............ *H01L 27/1266* (2013.01); *B60R 1/00* (2013.01); *B60R 11/0229* (2013.01);
(Continued)

(58) Field of Classification Search
CPC ............ H01L 27/1266; H01L 21/6835; H01L 21/76251; H01L 27/1218; H01L 27/3244
See application file for complete search history.

(56) References Cited

U.S. PATENT DOCUMENTS 4,722,765 A 2/1988 Ambros et al.
4,883,561 A 11/1989 Gmitter et al.
(Continued)

FOREIGN PATENT DOCUMENTS

CN 002299363 Y 12/1998
CN 001212114 A 3/1999
(Continued)

OTHER PUBLICATIONS

Takayama.T et al., "A CPU on a Plastic Film Substrate", 2004 Symposium on VLSI Technology : Digest of Technical Papers, Jun. 15, 2004, pp. 230-231, The IEEE Electron Devices Society / The Japan Society of Applied Physics.
(Continued)

*Primary Examiner* — Richard A Booth
(74) *Attorney, Agent, or Firm* — Nixon Peabody LLP; Jeffrey L. Costellia

(57) ABSTRACT

To provide a semiconductor device in which a layer to be peeled is attached to a base having a curved surface, and a method of manufacturing the same, and more particularly, a display having a curved surface, and more specifically a light-emitting device having a light emitting element attached to a base with a curved surface. A layer to be peeled, which contains a light emitting element furnished to a substrate using a laminate of a first material layer which is a metallic layer or nitride layer, and a second material layer which is an oxide layer, is transferred onto a film, and then the film and the layer to be peeled are curved, to thereby produce a display having a curved surface.

15 Claims, 15 Drawing Sheets

Related U.S. Application Data continuation of application No. 11/877,934, filed on Oct. 24, 2007, now abandoned, which is a division of application No. 10/303,080, filed on Nov. 25, 2002, now Pat. No. 7,335,573.

(51) Int. Cl.
| | |
|---|---|
| *H01L 21/762* | (2006.01) |
| *H01L 27/32* | (2006.01) |
| *B60R 1/00* | (2006.01) |
| *B60R 11/02* | (2006.01) |
| *B60R 11/04* | (2006.01) |
| *H01L 21/683* | (2006.01) |
| *B60R 11/00* | (2006.01) |

(52) U.S. Cl.
CPC .......... *B60R 11/04* (2013.01); *H01L 21/6835* (2013.01); *H01L 21/76251* (2013.01); *H01L 27/1218* (2013.01); *H01L 27/3244* (2013.01); *B60R 2011/004* (2013.01); *B60R 2300/202* (2013.01); *B60R 2300/802* (2013.01); *H01L 2221/6835* (2013.01); *H01L 2221/68318* (2013.01); *H01L 2221/68363* (2013.01); *H01L 2221/68386* (2013.01); *H01L 2227/323* (2013.01); *H01L 2227/326* (2013.01)

(56) References Cited

U.S. PATENT DOCUMENTS

| | | | |
|---|---|---|---|
| 5,206,749 A | 4/1993 | Zavracky et al. | |
| 5,256,562 A | 10/1993 | Vu et al. | |
| 5,258,320 A | 11/1993 | Zavracky et al. | |
| 5,258,325 A | 11/1993 | Spitzer et al. | |
| 5,273,475 A | 12/1993 | Oshikawa | |
| 5,300,788 A | 4/1994 | Fan et al. | |
| 5,317,236 A | 5/1994 | Zavracky et al. | |
| 5,317,436 A | 5/1994 | Spitzer et al. | |
| 5,331,149 A | 7/1994 | Spitzer et al. | |
| 5,341,015 A | 8/1994 | Kohno | |
| 5,362,671 A | 11/1994 | Zavracky et al. | |
| 5,376,561 A | 12/1994 | Vu et al. | |
| 5,376,979 A | 12/1994 | Zavracky et al. | |
| 5,377,031 A | 12/1994 | Vu et al. | |
| 5,396,304 A | 3/1995 | Salerno et al. | |
| 5,397,713 A | 3/1995 | Hamamoto et al. | |
| 5,420,055 A | 5/1995 | Vu et al. | |
| 5,438,241 A | 8/1995 | Zavracky et al. | |
| 5,444,557 A | 8/1995 | Spitzer et al. | |
| 5,453,405 A | 9/1995 | Fan et al. | |
| 5,467,154 A | 11/1995 | Gale et al. | |
| 5,475,514 A | 12/1995 | Salerno et al. | |
| 5,499,124 A | 3/1996 | Vu et al. | |
| 5,528,397 A | 6/1996 | Zavracky et al. | |
| 5,539,550 A | 7/1996 | Spitzer et al. | |
| 5,578,865 A | 11/1996 | Vu et al. | |
| 5,581,385 A | 12/1996 | Spitzer et al. | |
| 5,583,335 A | 12/1996 | Spitzer et al. | |
| 5,589,406 A | 12/1996 | Kato et al. | |
| 5,650,363 A | 7/1997 | Endroes et al. | |
| 5,654,811 A | 8/1997 | Spitzer et al. | |
| 5,661,371 A | 8/1997 | Salerno et al. | |
| 5,666,175 A | 9/1997 | Spitzer et al. | |
| 5,674,304 A | 10/1997 | Fukada et al. | |
| 5,692,820 A | 12/1997 | Gale et al. | |
| 5,702,963 A | 12/1997 | Vu et al. | |
| 5,705,424 A | 1/1998 | Zavracky et al. | |
| 5,713,652 A | 2/1998 | Zavracky et al. | |
| 5,736,768 A | 4/1998 | Zavracky et al. | |
| 5,743,614 A | 4/1998 | Salerno et al. | |
| 5,751,261 A | 5/1998 | Zavracky et al. | |
| 5,757,445 A | 5/1998 | Vu et al. | |
| 5,757,456 A | 5/1998 | Yamazaki et al. | |
| 5,781,164 A | 7/1998 | Jacobsen et al. | |
| 5,789,763 A | 8/1998 | Kato et al. | |
| 5,807,440 A | 9/1998 | Kubota et al. | |
| 5,817,548 A | 10/1998 | Noguchi et al. | |
| 5,821,138 A | 10/1998 | Yamazaki et al. | |
| 5,834,327 A | 11/1998 | Yamazaki et al. | |
| 5,851,862 A | 12/1998 | Ohtani et al. | |
| 5,856,030 A | 1/1999 | Burrows | |
| 5,861,929 A | 1/1999 | Spitzer | |
| 5,879,741 A | 3/1999 | Itoh | |
| 5,883,437 A | 3/1999 | Maruyama et al. | |
| 5,907,770 A * | 5/1999 | Yamazaki | H01L 21/2026 257/E21.119 |
| 5,929,961 A | 7/1999 | Nishi et al. | |
| 5,943,593 A | 8/1999 | Noguchi et al. | |
| 5,956,181 A | 9/1999 | Lin | |
| 5,981,306 A | 11/1999 | Burrows et al. | |
| 6,013,346 A | 1/2000 | Lewis et al. | |
| 6,013,982 A | 1/2000 | Thompson et al. | |
| 6,020,271 A | 2/2000 | Yanagida | |
| 6,027,958 A | 2/2000 | Vu et al. | |
| 6,033,974 A | 3/2000 | Henley et al. | |
| 6,043,800 A | 3/2000 | Spitzer et al. | |
| 6,059,913 A | 5/2000 | Asmussen et al. | |
| 6,072,445 A | 6/2000 | Spitzer et al. | |
| 6,096,581 A | 8/2000 | Zhang et al. | |
| 6,100,166 A | 8/2000 | Sakaguchi et al. | |
| 6,118,502 A | 9/2000 | Yamazaki et al. | |
| 6,121,950 A | 9/2000 | Zavracky et al. | |
| 6,127,199 A | 10/2000 | Inoue et al. | |
| 6,133,071 A | 10/2000 | Nagai | |
| 6,140,980 A | 10/2000 | Spitzer et al. | |
| 6,143,582 A | 11/2000 | Vu et al. | |
| 6,160,346 A | 12/2000 | Vleggaar et al. | |
| 6,162,571 A | 12/2000 | Duff et al. | |
| 6,190,937 B1 | 2/2001 | Nakagawa et al. | |
| 6,219,113 B1 | 4/2001 | Takahara | |
| 6,221,738 B1 | 4/2001 | Sakaguchi et al. | |
| 6,232,136 B1 | 5/2001 | Zavracky et al. | |
| 6,245,393 B1 | 6/2001 | Thompson et al. | |
| 6,246,169 B1 | 6/2001 | Pruvot | |
| 6,258,666 B1 * | 7/2001 | Mizutani | C23C 16/01 156/241 |
| 6,261,634 B1 | 7/2001 | Itoh | |
| 6,268,695 B1 | 7/2001 | Affinito | |
| 6,270,834 B1 | 8/2001 | Burrows | |
| 6,271,631 B1 | 8/2001 | Burrows | |
| 6,300,612 B1 | 10/2001 | Yu | |
| 6,309,764 B1 | 10/2001 | Burrows | |
| 6,310,362 B1 | 10/2001 | Takemura | |
| 6,317,175 B1 | 11/2001 | Salerno et al. | |
| 6,320,568 B1 | 11/2001 | Zavracky | |
| 6,320,640 B2 | 11/2001 | Nishi et al. | |
| 6,329,925 B1 | 12/2001 | Skiver et al. | |
| 6,340,641 B1 | 1/2002 | Muraguchi et al. | |
| 6,362,866 B1 | 3/2002 | Yamazaki et al. | |
| 6,372,608 B1 * | 4/2002 | Shimoda | G02F 1/13454 257/E21.567 |
| 6,376,333 B1 | 4/2002 | Yamazaki et al. | |
| 6,391,220 B1 | 5/2002 | Zhang et al. | |
| 6,403,985 B1 | 6/2002 | Fan et al. | |
| 6,414,783 B2 | 7/2002 | Zavracky et al. | |
| 6,420,283 B1 | 7/2002 | Ogawa et al. | |
| 6,423,614 B1 | 7/2002 | Doyle | |
| 6,424,020 B1 | 7/2002 | Vu et al. | |
| 6,429,095 B1 | 8/2002 | Sakaguchi et al. | |
| 6,448,152 B1 | 9/2002 | Henley et al. | |
| 6,455,397 B1 | 9/2002 | Belford | |
| 6,456,013 B1 | 9/2002 | Komiya et al. | |
| 6,479,837 B1 | 11/2002 | Ogawa et al. | |
| 6,486,929 B1 | 11/2002 | Vu et al. | |
| 6,489,041 B2 | 12/2002 | Henley et al. | |
| 6,492,026 B1 | 12/2002 | Graff et al. | |
| 6,504,524 B1 | 1/2003 | Gates et al. | |
| 6,506,664 B1 | 1/2003 | Beyne et al. | |
| 6,511,187 B1 | 1/2003 | Salerno et al. | |
| 6,512,624 B2 | 1/2003 | Tonar et al. | |
| 6,515,417 B1 | 2/2003 | Duggal et al. | |
| 6,521,511 B1 | 2/2003 | Inoue et al. | |
| 6,521,940 B1 | 2/2003 | Vu et al. | |

(56) References Cited

U.S. PATENT DOCUMENTS

| | | |
|---|---|---|
| 6,531,997 B1 | 3/2003 | Gates et al. |
| 6,538,632 B1 | 3/2003 | Yamazaki et al. |
| 6,544,430 B2 | 4/2003 | Mccormack et al. |
| 6,558,008 B1 | 5/2003 | Salerno et al. |
| 6,566,808 B1 | 5/2003 | Duggal et al. |
| 6,572,780 B2 | 6/2003 | Mccormack et al. |
| 6,582,996 B1 | 6/2003 | Hara et al. |
| 6,593,978 B2 | 7/2003 | Vu et al. |
| 6,608,654 B2 | 8/2003 | Zavracky et al. |
| 6,627,518 B1 | 9/2003 | Inoue et al. |
| 6,627,953 B1 | 9/2003 | Vu et al. |
| 6,628,355 B1 | 9/2003 | Takahara |
| 6,636,185 B1 | 10/2003 | Spitzer et al. |
| 6,645,830 B2 | 11/2003 | Shimoda et al. |
| 6,649,433 B2 | 11/2003 | Mikhael et al. |
| 6,661,029 B1 | 12/2003 | Duggal |
| 6,664,169 B1 | 12/2003 | Iwasaki et al. |
| 6,664,730 B2 | 12/2003 | Weaver |
| 6,680,577 B1 | 1/2004 | Inukai et al. |
| 6,682,990 B1 | 1/2004 | Iwane et al. |
| 6,683,333 B2 | 1/2004 | Kazlas et al. |
| RE38,466 E | 3/2004 | Inoue et al. |
| 6,700,322 B1 | 3/2004 | Duggal et al. |
| 6,700,631 B1 | 3/2004 | Inoue et al. |
| 6,707,160 B2 | 3/2004 | Yamaji |
| 6,737,285 B2 | 5/2004 | Iketani et al. |
| 6,737,753 B2 | 5/2004 | Kumar et al. |
| 6,774,010 B2 | 8/2004 | Chu et al. |
| 6,777,871 B2 | 8/2004 | Duggal et al. |
| 6,781,152 B2 | 8/2004 | Yamazaki |
| 6,784,113 B2 | 8/2004 | Hembree |
| 6,790,747 B2 | 9/2004 | Henley et al. |
| 6,800,999 B1 | 10/2004 | Duggal et al. |
| 6,802,926 B2 | 10/2004 | Mizutani et al. |
| 6,814,832 B2 | 11/2004 | Utsunomiya |
| 6,815,240 B2 | 11/2004 | Hayashi |
| 6,818,530 B2 | 11/2004 | Shimoda et al. |
| 6,821,553 B2 | 11/2004 | Miyashita et al. |
| 6,830,494 B1 | 12/2004 | Yamazaki et al. |
| 6,833,156 B2 | 12/2004 | Miyashita et al. |
| 6,838,192 B2 | 1/2005 | Miyashita et al. |
| 6,841,949 B2 | 1/2005 | Duggal |
| 6,863,961 B2 | 3/2005 | Miyashita et al. |
| 6,867,539 B1 | 3/2005 | Mccormick et al. |
| 6,875,671 B2 | 4/2005 | Faris |
| 6,878,607 B2 | 4/2005 | Inoue et al. |
| 6,882,102 B2 | 4/2005 | Yamazaki |
| 6,885,389 B2 | 4/2005 | Inoue et al. |
| 6,919,935 B2 | 7/2005 | Vu et al. |
| 6,940,223 B2 | 9/2005 | Yamazaki |
| 6,945,678 B2 | 9/2005 | Sugihara et al. |
| 6,998,282 B1 | 2/2006 | Yamazaki et al. |
| 7,042,432 B2 | 5/2006 | Yamazaki et al. |
| 7,061,186 B2 | 6/2006 | Inukai et al. |
| 7,075,501 B1 | 7/2006 | Spitzer et al. |
| 7,094,665 B2 | 8/2006 | Shimoda et al. |
| 7,111,968 B2 | 9/2006 | Bauer et al. |
| 7,119,364 B2 | 10/2006 | Yamazaki |
| 7,180,091 B2 | 2/2007 | Yamazaki et al. |
| 7,198,533 B2 | 4/2007 | Duggal et al. |
| 7,285,476 B2 | 10/2007 | Shimoda |
| 7,335,573 B2 | 2/2008 | Takayama et al. |
| 7,351,300 B2 | 4/2008 | Takayama et al. |
| 7,361,519 B2 | 4/2008 | Yamazaki et al. |
| 7,375,782 B2 | 5/2008 | Yamazaki et al. |
| 7,425,931 B1 | 9/2008 | Yamazaki et al. |
| 7,442,957 B2 | 10/2008 | Yamazaki et al. |
| RE40,601 E | 12/2008 | Inoue et al. |
| 7,468,308 B2 | 12/2008 | Shimoda |
| 7,612,753 B2 | 11/2009 | Koyama |
| 7,745,991 B2 | 6/2010 | Yamazaki et al. |
| 7,746,311 B2 | 6/2010 | Yamazaki et al. |
| 7,777,409 B2 | 8/2010 | Yamazaki et al. |
| 7,777,611 B2 | 8/2010 | Desai |
| 7,825,002 B2 | 11/2010 | Takayama et al. |
| 8,344,992 B2 | 1/2013 | Koyama |
| 8,497,509 B2 | 7/2013 | Yamazaki et al. |
| 8,786,772 B2 | 7/2014 | Tobinaga et al. |
| 8,957,442 B2 | 2/2015 | Seo et al. |
| 9,493,119 B2 | 11/2016 | Takayama et al. |
| 2001/0001050 A1 | 5/2001 | Miyashita et al. |
| 2001/0004121 A1 | 6/2001 | Sakama et al. |
| 2001/0009691 A1 | 7/2001 | Thompson et al. |
| 2001/0022362 A1 | 9/2001 | Hayashi |
| 2001/0030871 A1 | 10/2001 | Anderson, Jr. et al. |
| 2001/0033135 A1 | 10/2001 | Duggal et al. |
| 2001/0033347 A1 | 10/2001 | Kitahora et al. |
| 2001/0035863 A1 | 11/2001 | Kimura |
| 2001/0040645 A1 | 11/2001 | Yamazaki |
| 2002/0003201 A1 | 1/2002 | Yu |
| 2002/0004250 A1 | 1/2002 | Iketani et al. |
| 2002/0004292 A1 | 1/2002 | Yamazaki et al. |
| 2002/0030189 A1 | 3/2002 | Ishikawa |
| 2002/0041926 A1 | 4/2002 | Miyashita et al. |
| 2002/0048864 A1 | 4/2002 | Yamazaki et al. |
| 2002/0050958 A1 | 5/2002 | Matthies et al. |
| 2002/0106522 A1 | 8/2002 | Mccormack et al. |
| 2002/0117256 A1 | 8/2002 | Mccormack et al. |
| 2002/0136823 A1 | 9/2002 | Miyashita et al. |
| 2002/0146893 A1 | 10/2002 | Shimoda et al. |
| 2002/0155215 A1 | 10/2002 | Miyashita et al. |
| 2002/0190661 A1 | 12/2002 | Duggal et al. |
| 2003/0008437 A1 | 1/2003 | Inoue et al. |
| 2003/0020084 A1 | 1/2003 | Fan et al. |
| 2003/0024635 A1 | 2/2003 | Utsunomiya |
| 2003/0025118 A1 | 2/2003 | Yamazaki et al. |
| 2003/0025146 A1 | 2/2003 | Narwankar et al. |
| 2003/0032210 A1 | 2/2003 | Takayama et al. |
| 2003/0040164 A1 | 2/2003 | Inoue et al. |
| 2003/0047280 A1 | 3/2003 | Takayama et al. |
| 2003/0047732 A1 | 3/2003 | Yamazaki et al. |
| 2003/0054186 A1 | 3/2003 | Miyashita et al. |
| 2003/0057425 A1 | 3/2003 | Zavracky et al. |
| 2003/0059990 A1 | 3/2003 | Yamazaki |
| 2003/0062845 A1 | 4/2003 | Yamazaki et al. |
| 2003/0064569 A1 | 4/2003 | Takayama et al. |
| 2003/0068525 A1 | 4/2003 | Bellmann et al. |
| 2003/0075733 A1 | 4/2003 | Yamazaki et al. |
| 2003/0082889 A1 | 5/2003 | Maruyama et al. |
| 2003/0100169 A1 | 5/2003 | Tanaka et al. |
| 2003/0117369 A1 | 6/2003 | Spitzer et al. |
| 2003/0197197 A1 | 10/2003 | Brown et al. |
| 2003/0224582 A1 | 12/2003 | Shimoda et al. |
| 2004/0056180 A1 | 3/2004 | Yu |
| 2004/0085292 A1 | 5/2004 | Spitzer et al. |
| 2004/0087110 A1 | 5/2004 | Takayama et al. |
| 2004/0106237 A1 | 6/2004 | Yamazaki |
| 2004/0219762 A1 | 11/2004 | Shimoda et al. |
| 2005/0017255 A1 | 1/2005 | Yamazaki |
| 2005/0042477 A1 | 2/2005 | Miyashita et al. |
| 2006/0125410 A1 | 6/2006 | Duggal et al. |
| 2007/0082430 A1 | 4/2007 | Yamazaki |
| 2007/0222397 A1 | 9/2007 | Shiang et al. |
| 2008/0049437 A1 | 2/2008 | Takayama et al. |
| 2008/0309585 A1 | 12/2008 | Yamazaki et al. |
| 2009/0124062 A1 | 5/2009 | Yamazaki et al. |
| 2009/0291516 A1 | 11/2009 | Takayama et al. |
| 2013/0119408 A1 | 5/2013 | Koyama |

FOREIGN PATENT DOCUMENTS

| | | |
|---|---|---|
| CN | 001231065 A | 10/1999 |
| CN | 001430192 A | 7/2003 |
| EP | 0853254 A | 7/1998 |
| EP | 0858110 A | 8/1998 |
| EP | 0880303 A | 11/1998 |
| EP | 0909972 A | 4/1999 |
| EP | 0917409 A | 5/1999 |
| EP | 0924769 A | 6/1999 |
| EP | 0935389 A | 8/1999 |
| EP | 0951057 A | 10/1999 |
| EP | 1014452 A | 6/2000 |
| EP | 1093167 A | 4/2001 |
| EP | 1103947 A | 5/2001 |

(56) References Cited

FOREIGN PATENT DOCUMENTS

| | | |
|---|---|---|
| EP | 1111966 A | 6/2001 |
| EP | 1120838 A | 8/2001 |
| EP | 1121000 A | 8/2001 |
| EP | 1122794 A | 8/2001 |
| EP | 1130566 A | 9/2001 |
| EP | 1211916 A | 6/2002 |
| EP | 1237191 A | 9/2002 |
| EP | 1351308 A | 10/2003 |
| EP | 1376716 A | 1/2004 |
| EP | 1376717 A | 1/2004 |
| EP | 1655633 A | 5/2006 |
| EP | 1744365 A | 1/2007 |
| EP | 1758169 A | 2/2007 |
| EP | 2256718 A | 12/2010 |
| GB | 2283350 | 5/1995 |
| JP | 01-253190 A | 10/1989 |
| JP | 02-500051 | 1/1990 |
| JP | 03-065925 A | 3/1991 |
| JP | 04-010391 A | 1/1992 |
| JP | 05-090623 A | 4/1993 |
| JP | 05-121170 A | 5/1993 |
| JP | 05-347186 A | 12/1993 |
| JP | 06-504139 | 5/1994 |
| JP | 06-214220 A | 8/1994 |
| JP | 06-295787 A | 10/1994 |
| JP | 07-092501 A | 4/1995 |
| JP | 07-142570 A | 6/1995 |
| JP | 08-288522 A | 11/1996 |
| JP | 09-022026 A | 1/1997 |
| JP | 09-297316 A | 11/1997 |
| JP | 10-020293 A | 1/1998 |
| JP | 10-095189 A | 4/1998 |
| JP | 10-125929 A | 5/1998 |
| JP | 10-125930 A | 5/1998 |
| JP | 10-125931 A | 5/1998 |
| JP | 11-024102 A | 1/1999 |
| JP | 11-026733 A | 1/1999 |
| JP | 11-074075 A | 3/1999 |
| JP | 11-074533 A | 3/1999 |
| JP | 11-087799 A | 3/1999 |
| JP | 11-109324 A | 4/1999 |
| JP | 11-121751 A | 4/1999 |
| JP | 11-135882 A | 5/1999 |
| JP | 11-232954 A | 8/1999 |
| JP | 11-272205 A | 10/1999 |
| JP | 07-291035 A | 11/1999 |
| JP | 2000-022462 A | 1/2000 |
| JP | 2000-177483 A | 6/2000 |
| JP | 2000-243970 A | 9/2000 |
| JP | 2000-516388 | 12/2000 |
| JP | 2001-044445 A | 2/2001 |
| JP | 2001-060697 A | 3/2001 |
| JP | 2001-085154 A | 3/2001 |
| JP | 2001-102595 A | 4/2001 |
| JP | 2001-066301 A | 6/2001 |
| JP | 2001-185354 A | 7/2001 |
| JP | 2001-189460 A | 7/2001 |
| JP | 2001-217075 A | 8/2001 |
| JP | 2001-222240 A | 8/2001 |
| JP | 2001-261864 A | 9/2001 |
| JP | 2001-267578 A | 9/2001 |
| JP | 2001-513911 | 9/2001 |
| JP | 2001-290439 A | 10/2001 |
| JP | 2001-318624 A | 11/2001 |
| JP | 2001-319789 A | 11/2001 |
| JP | 3238223 | 12/2001 |
| JP | 2002-184959 A | 6/2002 |
| JP | 2002-328624 A | 11/2002 |
| JP | 2003-045890 A | 2/2003 |
| JP | 2003-142666 A | 5/2003 |
| JP | 2003-163338 A | 6/2003 |
| JP | 2003-229548 A | 8/2003 |
| KR | 1998-025216 B | 7/1998 |
| KR | 1999-0067067 A | 8/1999 |
| KR | 2000-0062303 A | 10/2000 |
| KR | 2001-0040506 A | 5/2001 |
| KR | 2001-0062574 A | 7/2001 |
| KR | 2001-0078229 A | 8/2001 |
| WO | WO-1988/000715 | 1/1988 |
| WO | WO-1992/012453 | 7/1992 |
| WO | WO-1992/013363 | 8/1992 |
| WO | WO-1993/015589 | 8/1993 |
| WO | WO-1993/016491 | 8/1993 |
| WO | WO 1993/018428 | 9/1993 |
| WO | WO-1994/007177 | 3/1994 |
| WO | WO-1994/010600 | 5/1994 |
| WO | WO-1994/010794 | 5/1994 |
| WO | WO-1994/018791 | 8/1994 |
| WO | WO-1995/025983 | 9/1995 |
| WO | WO-1998/021750 | 5/1998 |
| WO | WO-1998/028946 | 7/1998 |
| WO | WO-1998/030069 | 7/1998 |
| WO | WO-1998/039176 | 9/1998 |
| WO | WO-1999/039372 | 8/1999 |
| WO | WO-1999/044242 | 9/1999 |
| WO | WO-2000/046854 | 8/2000 |
| WO | WO-2001/051281 | 7/2001 |

OTHER PUBLICATIONS

Korean Office Action (Application No. 2007-0122255) dated Mar. 25, 2009.
Korean Office Action (Application No. 2007-0122256) dated Mar. 31, 2009.
Japanese Office Action (Application No. 2002-348184) dated Nov. 4, 2009.
Korean Office Action (Application No. 2009-0103929) dated Jul. 22, 2010.
Chinese Office Action (Application No. 200910207613.1) dated Mar. 3, 2011.
Korean Office Action (Application No. 2010-0092767) dated Apr. 25, 2012.
Chinese Office Action (Application No. 201310079220.3) dated Feb. 28, 2015.

\* cited by examiner

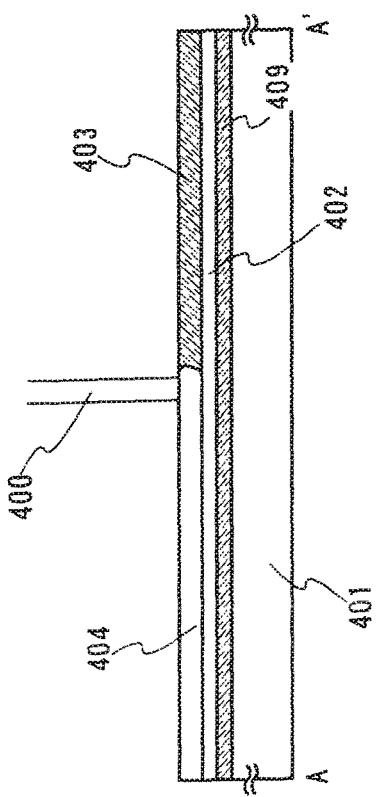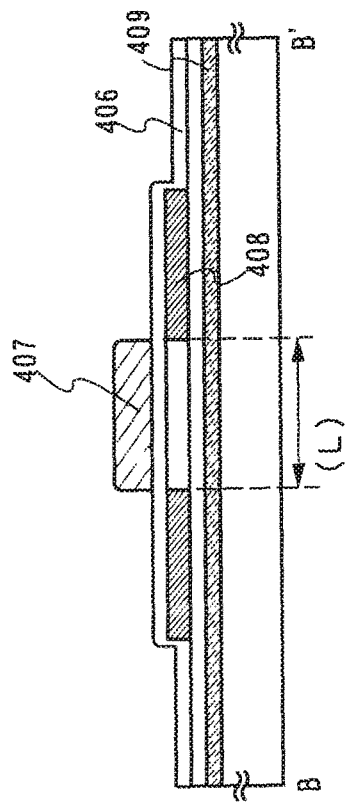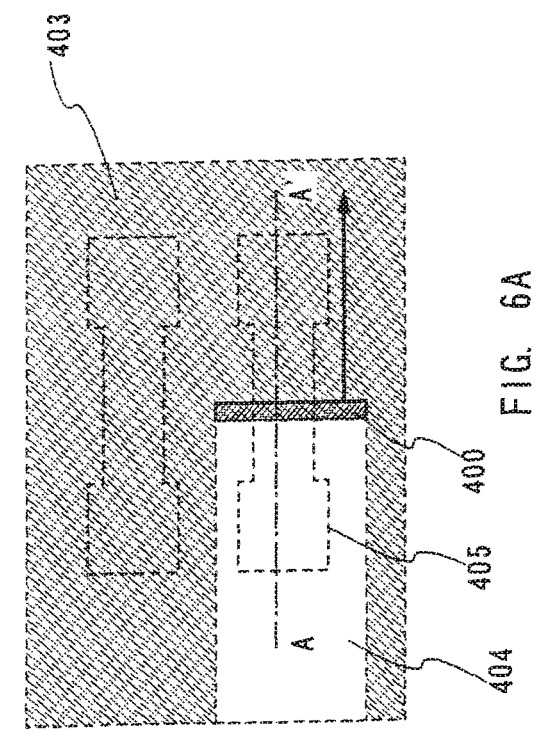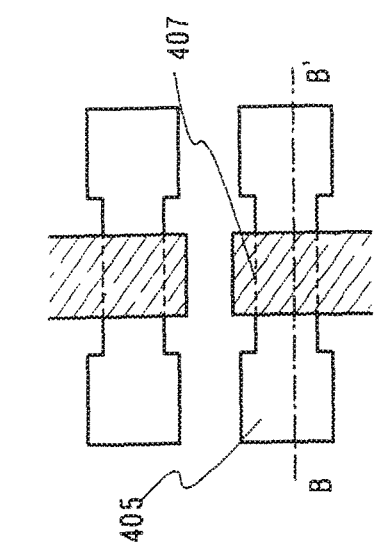
FIG. 6A
FIG. 6B
FIG. 6C
FIG. 6D

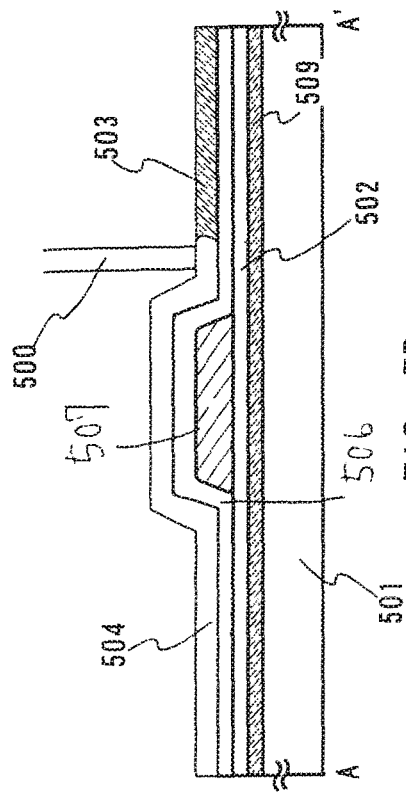
FIG. 7A
FIG. 7B
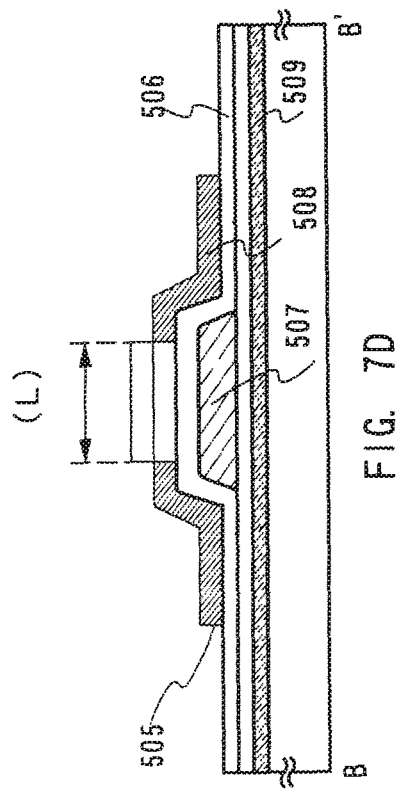
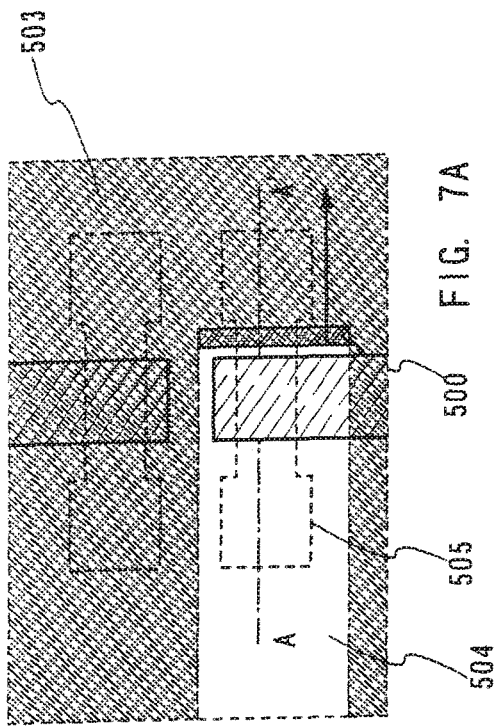
FIG. 7C
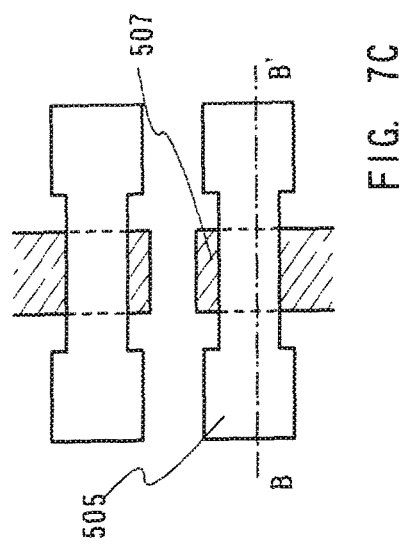
FIG. 7D

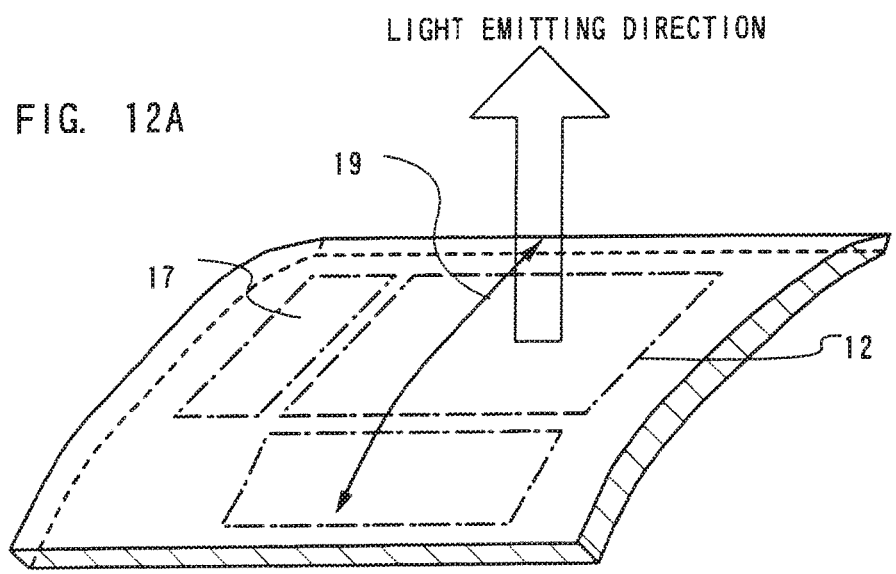
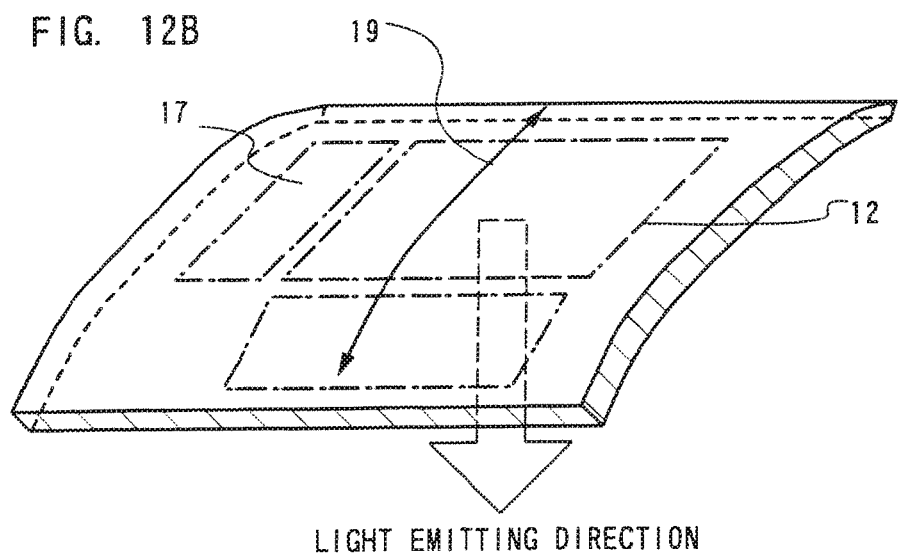

LASER LIGHT

VEHICLE, DISPLAY DEVICE AND MANUFACTURING METHOD FOR A SEMICONDUCTOR DEVICE

BACKGROUND OF THE INVENTION

1. Field of the Invention

The present invention relates to a semiconductor device having a circuit composed of thin film transistors (hereinafter referred to as TFTs) transferred by bonding a layer to be peeled off to a base member. More particularly, the present invention relates to an electro-optical device which is represented by a liquid crystal module, a light emitting device which is represented by an EL module, and electronic equipment on which such a device is mounted as a part. Further, the present invention relates to a manufacturing method of all these devices and apparatuses mentioned above.

Note that a semiconductor device in this specification indicates general devices functioning by utilizing semiconductor characteristics, and an electro-optical device, a light emitting device, a semiconductor circuit, and electronic equipment are all semiconductor devices.

2. Description of the Related Art

In recent years, a technique of constructing a thin film transistor (TFT) using a semiconductor thin film (about several to several hundred nm in thickness) formed on a substrate having an insulating surface has been noted. The thin film transistor is widely applied to an electronic device such as an IC or an electro-optical device. In particular, the development of the thin film transistor as a switching element of an image display device is urgently necessary.

Further, concern over mounting, for example, a navigation system display device, an audio operation screen display device and a measuring display device into various display devices of vehicles such as an automobile and aircraft has been attempted.

Various applications utilizing such an image display device are expected, and particularly its utilization in a portable device is noted. Currently, a glass substrate or a quartz substrate is used for forming the TFT in many cases. However, there is a defect that the above substrate is easy to crack and heavy. In addition, in the case of mass production, it is difficult and thus not suitable to use a large size glass substrate and a large size quartz substrate. Thus, it is attempted to form a TFT element on a flexible substrate, typically, a flexible plastic film.

However, the plastic film has a low heat resistance, so that it is necessary to reduce a maximum temperature of a process. As a result, under the current circumstances, a TFT having a preferable electrical characteristic cannot be formed on the plastic film as compared with the case where the glass substrate is used. Therefore, a liquid crystal display device and a light emitting element for which the plastic film is used and which each have a high performance are not realized.

If a light emitting device in which an organic light emitting element (OLED: organic light emitting device) is formed or a liquid crystal display device can be manufactured on a flexible substrate such as a plastic film, such a device can be used for a display having a curved surface, a show window and the like in addition to being thin and light weight. Thus, its use is not limited to only a mobile device and the scope of application is very wide.

Further, if a display having a curved surface becomes available, in the case where an imaging or measuring display is to be furnished in a limited space such as at the driver's seat in an automobile or aircraft or other such vehicle, the display can be mounted to various locations that have curved surfaces (such as the window, the ceiling, the door, the dashboard, etc.), thereby reducing the space occupied by the display. Since the display has been a flat one up to now, space in vehicles has been narrowed, or, complicated operations for embodying a flat display, such as operations for cutting off the walls, attaching and the like have been required.

SUMMARY OF THE INVENTION

An object of the present invention is to provide a semiconductor device in which a layer to be peeled off is bonded to a base member having a curved surface and a manufacturing method thereof. More particularly, an object of the present invention is to provide a display having a curved surface, specifically, a light emitting device having a light emitting element in which a layer containing an organic compound serves as a light emitting layer is bonded to the base member having a curved surface, or a liquid crystal display device in which a layer to be peeled off is bonded to the base member having the curved surface.

Also, another object of the present invention is to provide a semiconductor device in which various elements (a thin film diode, a photoelectric conversion element which is made of silicon and has a PIN junction, and a silicon resistor element) represented by a TFT are bonded to a flexible film (bendable film) and a manufacturing method thereof.

According to the present invention, when forming a layer to be peeled off containing an element onto a substrate, the channel length directions of the regions functioning as channels for the element are all arranged in the same direction, and irradiation of laser light that scans in the same direction as the channel lengths is performed, whereby the element is completed. After that, the element is applied to a base having a curved surface curving in a different direction than the above-mentioned channel length direction, that is, curving along the direction of the channel width, and thus a display having a curved surface is realized. Note that, in the case where the peeled layer is applied to the base with the curved surface, the peeled layer will also be curved along the curved surface of the base. In the present invention, all the channel length directions of the elements are arranged going in the same direction, while the channel length directions and the direction that the base is curved are different. Therefore, even if the peeled layer containing the elements is curved, any influence on the characteristics of the elements can be kept at a minimum. In other words, it is also possible to provide a semiconductor device that is sturdy with respect to deformation along a certain direction (here meaning the direction along which the base is curved).

The construction of the invention with respect to a manufacturing method disclosed in the present specification is as follows:

That is, according to the present invention, there is provide a manufacturing method for a semiconductor device, including:

a step of forming a layer to be peeled off containing an element onto a substrate;

a step of attaching a support to the layer peeled containing the element, and then peeling the support from the substrate using physical means; and a step of attaching a transfer body to the layer to be peeled off containing the element, and sandwiching the element between the support and the transfer body, the method being characterized in that:

the element is a thin film transistor in which semiconductor layers overlapping with a gate cathode while sandwiching an insulating film therebetween serve as channels, and the step of forming the semiconductor layers includes a process of irradiating a laser light that scans in the same direction as channel length directions of the channels.

However, according to the above-mentioned construction, if the mechanical strength of the layer to be peeled off is sufficient, the transfer body which anchors the layer to be peeled off may not need to be attached.

Note that, the above-mentioned construction is characterized in that a plurality of the thin film transistors are provided, and the channel length directions of the plurality of thin film transistors are all arranged in the same direction.

Further, the above-mentioned construction is characterized in that the above-mentioned support has a curved surface that is curved in a convex or concave shape, and the direction in which the above-mentioned support is curved and the direction of the above-mentioned channel lengths are different from each other. Further, in the case where a transfer body is to be attached, the transfer body also has a curved surface that is curved in a concave or convex shape fitting with the curved surface of the support. Therefore, the above-mentioned construction is characterized in that the above-mentioned transfer body has the concave or convex curved surface, and the direction in which the above-mentioned support is curved and the direction of the above-mentioned channel lengths are different.

Further, the above-mentioned construction is characterized in that when it is formed as a liquid crystal display device, the above-mentioned support is an opposing substrate, the above-mentioned element has a pixel electrode, and the space between the pixel electrode and the opposing substrate is filled with a liquid crystal material.

Further, the above-mentioned construction is characterized in that when it is formed as a light emitting device having a light emitting element in which a layer containing an organic compound serves as a light emitting layer, the above-mentioned support is a sealing material, and the above-mentioned element is the light emitting element.

Further, according to the above-mentioned construction, the method of performing the peeling is not particularly restricted, and it is possible to use a method in which a separation layer is provided between the layer to be peeled off and the substrate, and the separation layer is removed by means of a chemical solution (an etchant) to separate the layer to be peeled off and the substrate, or a method in which a separation layer constituted of amorphous silicon (or polysilicon) is provided between the layer to be peeled off and the substrate, and laser light is irradiated through the substrate to expel hydrogen contained in the amorphous silicon, whereby gaps are created and the layer to be peeled off and the substrate are thus separated. Note that, in the case where the laser light is used for the peeling, the elements contained in the layer to be peeled off should be formed with the thermal processing temperature set at 410° C. or less so that the hydrogen is not expelled before the peeling.

Further, as another method of peeling, it is also possible to use a peeling method in which film stress occurring between two layers is utilized to perform the peeling. In this peeling method, a metallic layer, preferably a nitrided metallic layer, is provided onto the substrate, and then an oxidized layer is provided contacting the above-mentioned nitrided metallic layer, so that the element is formed onto the oxidized layer. In this case, the film will not peel off even during the film application processing or during thermal processing at over 500° C., and a clean separation within the oxidized layer or at its surface can be achieved easily with a physical means. Further, in order to further the peeling, thermal processing or laser radiation processing may be performed before performing the peeling with the above-mentioned physical means.

According to the manufacturing method of the present invention for manufacturing a semiconductor device using a peeling method in which film stress occurring between the two layers is utilized to perform the peeling, there is provided a method of manufacturing a semiconductor device, characterized by including:

a first step of forming onto a first substrate a layer to be peeled off that contains a semiconductor element;

a second step of adhering a second substrate to the layer to be peeled off with a first adhesive, and sandwiching the layer to be peeled off between the first substrate and the second substrate;

a third step of separating the layer to be peeled off and the first substrate;

a fourth step of adhering a third substrate to the layer to be peeled off with a second adhesive, and sandwiching the layer to be peeled off between the second substrate and the third substrate;

a fifth step of separating the layer to be peeled off and the second substrate, and forming the layer to be peeled off, for which the second adhesive and the third substrate serve as a support; and a sixth step of curving the third substrate.

According to the above-mentioned construction, in the fifth step, the first adhesive is dissolved in a solvent and removed, and the layer to be peeled off and the second substrate are separated, or alternatively the first adhesive is a photosensitive adhesive, and, in the fifth step, light is irradiated to separate the layer to be peeled off and the second substrate. Further, it is desirable that the first substrate and the second substrate are materials which are more rigid than the third substrate, and the third substrate is a substrate which is bendable.

Note that, also in the above-mentioned construction, it is preferable that the above-mentioned semiconductor element is a thin film transistor in which a semiconductor layer that overlaps the gate electrode while sandwiching an insulating film therebetween serves as a channel, and the steps of forming the above-mentioned semiconductor layer involve radiating a laser light which scans in the same direction as the channel length direction of the above-mentioned channel.

According to the manufacturing method of the present invention for manufacturing a semiconductor device having a light emitting element in which a layer containing an organic compound serves as a light emitting layer, by using a peeling method in which film stress occurring between the two layers is utilized to perform the peeling, there is provided a method of manufacturing a semiconductor device, characterized by including:

a first step of forming onto a first substrate a layer to be peeled off that contains one of a semiconductor element and a light emitting element in which a layer containing an organic compound serves as a light emitting layer;

a second step of adhering a second substrate to the layer to be peeled off with a first adhesive, and sandwiching the layer to be peeled off between the first substrate and the second substrate to which a film is applied;

a third step of separating the layer to be peeled off and the first substrate;

a fourth step of adhering a third substrate to the layer to be peeled off with a second adhesive, and sandwiching the layer to be peeled off between the second substrate and the third substrate;

a fifth step of separating the film and the second substrate, and forming the layer to be peeled off, for which the film, the second adhesive and the third substrate serve as a support; and a sixth step of curving the third substrate.

According to the above-mentioned construction, the film is a tape having a photosensitive adhesive on one or both sides thereof, and, in the fifth step, light is irradiated to separate the film and the second substrate. Further, it is desired that the first substrate and the second substrate are materials which are more rigid than the third substrate, and the third substrate is a substrate which is bendable.

Note that, also in the above-mentioned construction, it is preferable that the above-mentioned semiconductor element is a thin film transistor in which a semiconductor layer that overlaps the gate electrode while sandwiching an insulating film therebetween serves as a channel, and the steps of forming the above-mentioned semiconductor layer involve radiating a laser light which scans in the same direction as the channel length direction of the above-mentioned channel.

The semiconductor device obtained according to the above-mentioned manufacturing method of the present invention as described above, has various characteristics.

First construction of the present invention as disclosed in the present specification relates to a semiconductor device, characterized in that a plurality of thin film transistors are provided on a base having a curved surface curved in a concave or convex shape, and the channel length directions of the thin film transistors are all arranged in the same direction, and the above-mentioned channel length directions run in a different direction from the direction in which the above-mentioned base is curved.

Further, the present invention may also be applied in a case where different thin film transistors are formed to a pixel portion and to a drive circuit, respectively. That is, according to second construction of the invention that represents another construction thereof, there is provided a semiconductor device, characterized in that a pixel portion and a drive circuit portion are formed onto a substrate having a curved surface that is curved in a concave or a convex shape and the channel length direction of a thin film transistor provided to the above-mentioned pixel portion and the channel length direction of a thin film transistor provided to the drive circuit portion are arranged so as to run in the same direction, and the above-mentioned channel length direction is different from the direction in which the base is curved. Note that, the design rule of this pattern is approximately from 5 to 20 μm, and approximately $10^6$ to $10^7$ TFTs are built onto the substrate for the drive circuit and for the pixel portion, respectively.

Further, each of the above-mentioned constructions is characterized in that the above-mentioned channel length direction is the same direction as the scanning direction by the laser light that is irradiated onto the semiconductor layer of the above-mentioned thin film transistor. In a case where the channel for the thin film transistor is formed using a semiconductor film that is crystallized on the substrate by laser annealing, when the crystal growth direction and the carrier's movement direction are aligned with each other, high field effect mobility can be obtained. In other words, by aligning the crystal formation direction and the channel length direction, the field effect mobility can be raised substantially. In a case where a continuously oscillating laser beam is irradiated onto a non-monocrystal semiconductor film to achieve the crystallization, the liquid/solid boundary can be maintained and continuous crystal growth can be achieved along the laser beam's scan direction. For the laser light, it is possible to use a gas laser such as an excimer laser, a solid-state laser such as a YAG laser, or a semiconductor laser. Further, the laser oscillation may be either continuous oscillation or pulse oscillation, and the shape of the laser beam may be linear or rectangular.

Further, each of the above-mentioned constructions is characterized in that the above-mentioned curving direction and the above-mentioned channel length direction run perpendicular to each other. That is, the direction perpendicular to the channel length direction is the channel width direction, and third construction of the present invention which represents another construction thereof relates to a semiconductor characterized in that a plurality of thin film transistors are provided onto a base having a curved surface that is curved in a concave or a convex shape, the channel width directions of the plurality of thin film transistors are all arranged in the same direction, and the above-mentioned channel width directions run in the same direction as the direction in which the above-mentioned base is curved.

Note that, in the above-mentioned third construction, the above-mentioned channel width direction is perpendicular to the scan direction of the laser light irradiated onto the semiconductor layer of the above-mentioned thin film transistor.

Further, the base with the curved surface is curved in a concave or a convex shape. When it is curved in a certain single direction, it can be said that the base has a curved surface with a curvature along one direction, and with no curvature along another direction. Therefore, fourth construction of the present invention which represents another construction thereof relates to a semiconductor device, characterized in that the channel length directions of a plurality of thin film transistors provided onto a surface of a base having a curved surface with a curvature along one direction and with no curvature along another direction are all arranged in the same direction, and the above-mentioned channel length directions and the direction without curvature run in the same direction.

Note that, the above-mentioned fourth construction is characterized in that the above-mentioned channel length direction is the same direction as the scan direction of the laser light irradiated onto the semiconductor layers of the above-mentioned thin film transistors.

Further, the present invention can be applied to a flexible film (a film that can be curved), and is more preferably applied in a case where the peeled layer is applied to a film that is curved in one direction. Note that, the flexible film is not curved when in its normal state, but rather is curved in a certain direction by means of some external force. Thus, fifth construction of the present invention which represents another construction thereof relates to a semiconductor device, characterized in that a plurality of thin film transistors are provided onto a base that can be curved into a concave shape or a convex shape, the channel length directions of the plurality of thin film transistors are all arranged in the same direction, and the direction in which the above-mentioned base is bent and the above-mentioned channel length direction are different from each other.

Note that, the above-mentioned fifth construction is characterized in that the above-mentioned channel length directions are the same direction as the scan direction of laser light that is irradiated onto the semiconductor layers of the thin film transistors. Further, in the above-mentioned fifth construction, the above-mentioned curved direction and the above-mentioned channel length directions cross each other perpendicularly, which is to say that the above-mentioned curved direction and the channel width directions run in the same direction.

Note that, in the present specification, the transfer body refers to a base which is adhered to the peeled layer after the peeling, and, provided that it has a curved surface, it may be formed of plastic, glass, metal, ceramic or a material of any other composition without restriction. Further, in the present specification, the support refers to a base which is adhered to the layer to be peeled off when the peeling is performed with the physical means, and it may be formed of plastic, glass, metal, ceramic or a material of any other composition without particular restriction. Further, the shape of the transfer body and the shape of the support are not particularly restricted, and they may have flat surfaces, they may have curved surfaces, they may be curved, and they may be film shaped. Further, if light-weight is to be given top priority, then a film-shape plastic substrate is desirable, such as, for example, polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarilate (PAR), polybutylene terephthalate (PBT) and the like.

Further, the above-mentioned respective manufacturing methods enable realization of a display having a curved surface, which can be mounted in a vehicle such as an automobile, an aircraft, a seagoing vessel, a train, and the like. An interior wall, ceiling, or other part of the vehicle is formed of a smooth and curved surface so that the large open space can be secured inside the vehicle and no problem occurs even when a person's body bumps into it for some reason. Thus, Construction 6 of the present invention which represents another construction thereof relates to a vehicle in which there is mounted a display device having a thin film transistor and a light emitting element in which a layer containing an organic compound serves as a light emitting layer, as a measuring instrument or as an illumination device. The display device having the thin film transistor and the light emitting element in which a layer containing an organic compound serves as a light emitting layer is preferably of an active matrix-type, but it is also possible to manufacture a passive-type display device as well.

For example, a window of the vehicle may be used as the base, and the display device having the light emitting element in which a layer containing an organic compound serves as a light emitting layer may be curved and adhered to fit the curved surface of the window, thereby enabling display of an image or of a measuring instrument. More particularly, the display device having the light emitting element in which a layer containing an organic compound serves as a light emitting layer can be made extremely thin and lightweight, such that the space inside the vehicle is not altered. In the case where the display device having the light emitting element in which a layer containing an organic compound serves as a light emitting layer is attached to the window of the vehicle, it is desirable that the substrate, the electrodes and the wiring be transparent, and a film for blocking external light may also be provided. Further, it is desirable that the scenery of the outside can be viewed without obstruction when a display is not being performed.

Further, display of an image or a measuring instrument can also be performed when the display having the light emitting element in which the layer containing the organic compound serves as the light emitting layer is curved and attached along the interior wall, door, seat or dashboard of the vehicle. Since it is sufficient simply to attach the flexible display device of the present invention along a curved surface, the process of installing the display device is simple, and it is not particularly necessary to perform local machining of the interior wall, door, seat, or dashboard portion. Further, in an automobile, for example, if the automobile is driven from the right-hand side, there is a blind spot on the rear left side since a portion of the vehicle body (a portion between the windows) exists there. However, if the flexible display device of the present invention is attached to the portion between the windows and a camera capable of capturing the blind spot is attached on the exterior of the vehicle, and the display device and the camera are attached to each other, then the driver can confirm the blind spot. In particular, the display device having the light emitting element in which the layer containing the organic compound material serves as the light emitting layer can handle moving images better than a liquid crystal display, and provides a display device with a wide field of vision.

Further, by using the ceiling of the vehicle as the base and curving and attaching the display device having the light emitting element in which the layer containing the organic compound material serves as the light emitting layer along the curved surface of the ceiling, it becomes possible to perform an image display and interior lighting. Further, in an automobile, for example, if the flexible display device of the present invention is attached to the portions between the windows and then a camera corresponding to each of the display devices and capable of capturing the outside view is mounted onto the exterior of the car and the displays and the camera are attached to each other, then the people inside the vehicle can enjoy the scenery of the outside as if in a convertible car with the roof down, even though they are inside the vehicle. Further, in a train or electric train, for example, if the flexible display device of the present invention is attached to a widow and/or wall, then advertisements and television images can be displayed without reducing the open space within the train. More particularly, the display device having the light emitting element in which the layer containing the organic compound material serves as the light emitting layer provides a display device offering a wider field of vision than a liquid crystal display device.

In the above-mentioned vehicle, if the radius of curvature of the mounted display device is from 50 cm to 200 cm, then the thin film transistors and the light emitting element in which the layer containing the organic compound material serves as the light emitting layer can be driven without problems. Note that, it is preferable that the channel length directions of the plural thin film transistors that are provided are all arranged in the same direction, and the above-mentioned channel length direction is different from the direction in which the above-mentioned base is curved.

BRIEF DESCRIPTION OF THE DRAWINGS

In the accompanying drawings:

FIG. 6A to 6D are diagrams for explaining the laser beam scan direction along a semiconductor film, and steps of manufacturing a top gate-type TFT;

FIG. 7A to 7D are diagrams for explaining the laser beam scan direction along the semiconductor film, and steps of manufacturing a bottom gate-type TFT;

FIGS. 12A and 12B are external views of a curved semiconductor device having a light emitting element in which a layer containing organic material serves as the light emitting layer, according to Embodiment 4 of the present invention;

DETAILED DESCRIPTION OF THE PREFERRED EMBODIMENTS

An embodiment mode of the present invention will be described below.

Hereinafter, a typical manufacturing order according to the present invention will be briefly described using FIGS. 1A to 1C and 2.

Figure 1A:
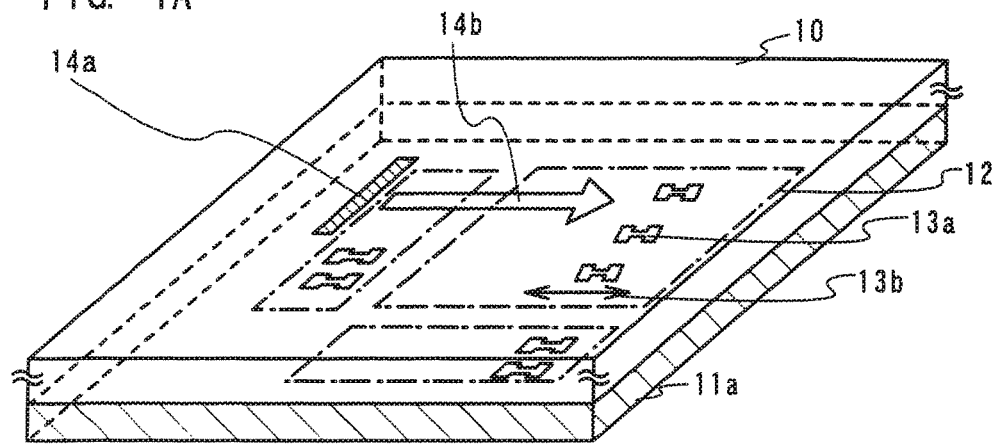
FIGS. 1A to 1C are diagrams of steps illustrating an embodiment mode of the present invention.

In FIG. 1A, reference numeral 10 denotes a substrate, 11a denotes a layer to be peeled, 12 denotes a pixel portion provided to the layer to be peeled, 13a denotes a semiconductor layer provided in the pixel portion, 13b denotes a channel length direction of the semiconductor layer 13a, 14a denotes a laser light irradiation area, and 14b denotes a laser light irradiation direction.

FIG. 1A shows a manufacturing step indicating the course of a completion of the layer to be peeled and is a schematic view indicating processing for irradiating laser light to the semiconductor layer. Laser crystallization and laser annealing can be conducted by the laser light irradiation processing. An oscillation mode may be either continuous oscillation or pulse oscillation. In order to continuously produce crystal growth with a molten state of the semiconductor film, it is desirable that a continuous oscillation mode is selected.

In FIG. 1A, all channel length directions of a large number of semiconductor layers included in the layer to be peeled are aligned with the same direction. In addition, assume that the laser light irradiation direction, that is, a scanning direction is the same direction as the channel length directions. Thus, when the crystal growth direction is aligned with the channel length direction, the field effect mobility can be substantially increased. Note that the example in which linear laser light irradiation is conducted is shown in FIG. 1A. However, the present invention is not particularly limited to this. In addition, here, the laser light irradiation is conducted after patterning the semiconductor layer. The laser light irradiation may be conducted before the patterning.

Next, various elements (such as a thin film diode, a photoelectric conversion element which is made of silicon and has a PIN junction, and a silicon resistor element) represented by a TFT are produced by forming electrodes, wirings, an insulating film, and the like to complete the layer to be peeled 11b, and then the layer to be peeled 11b is peeled from the substrate 10.

Note that the peeling method is not particularly limited. Here, a peeling method utilizing film stresses of a metallic layer or a nitride layer and an oxide layer is used as a peeling method which is not limited by a heat treatment temperature and a kind of substrate. First, before the state shown in FIG. 1A is obtained, a nitride layer or a metallic layer (not shown) is formed on the substrate 10. A typical example of the nitride layer or the metallic layer includes a single layer made of an element selected from the group consisting of Ti, W, Al, Ta, Mo, Cu, Cr, Nd, Fe, Ni, Co, Ru, Rh, Pd, Os, Ir, and Pt, or an alloy material or a compound material which contains mainly the element, or a laminate of those. In addition, a single layer made of nitride containing the element, for example, titanium nitride, tungsten nitride, tantalum nitride, or molybdenum nitride, or a laminate of those may be used. Next, an oxide layer (not shown) is formed on the nitride layer or the metallic layer. For a typical example of the oxide layer, a silicon oxide material, a silicon oxynitride material, or a metallic oxide material may be used. Note that the oxide layer may be formed by any film formation method such as a sputtering method, a plasma CVD method, or an applying method. It is important that film stress of the oxide layer is different from that of the nitride layer or the metallic layer. The respective film thicknesses are preferably set as appropriate in a range of 1 nm to 100 nm, thereby adjusting respective film stresses. In addition, an insulating layer or a metallic layer may be provided between the substrate and the nitride layer or the metallic layer to improve the contact property to the substrate 10. Next, a semiconductor layer is preferably formed on the oxide layer to obtain the layer to be peeled 11a. Note that, according to the above peeling method, even if the film stress of the oxide layer is different from that of the nitride layer or the metallic layer, film peeling or the like is not caused by heat treatment in a manufacturing step for the layer to be peeled. In addition, according to the above peeling method, the film stress of the oxide layer is different from that of the nitride layer or the metallic layer. Thus, peeling can be produced by relatively small force. In addition, the example in which the layer to be peeled 11b having a sufficient mechanical strength is assumed is indicated here. When the mechanical strength of the layer to be peeled 11b is insufficient, it is preferable that peeling is conducted after a support member (not shown) for fixing the layer to be peeled 11b is bonded thereto. Note that, when the layer to be peeled 11b is peeled, it is important to prevent a bend of the layer to be peeled 11b so that a crack is not caused in the layer to be peeled.

Figure 1B:
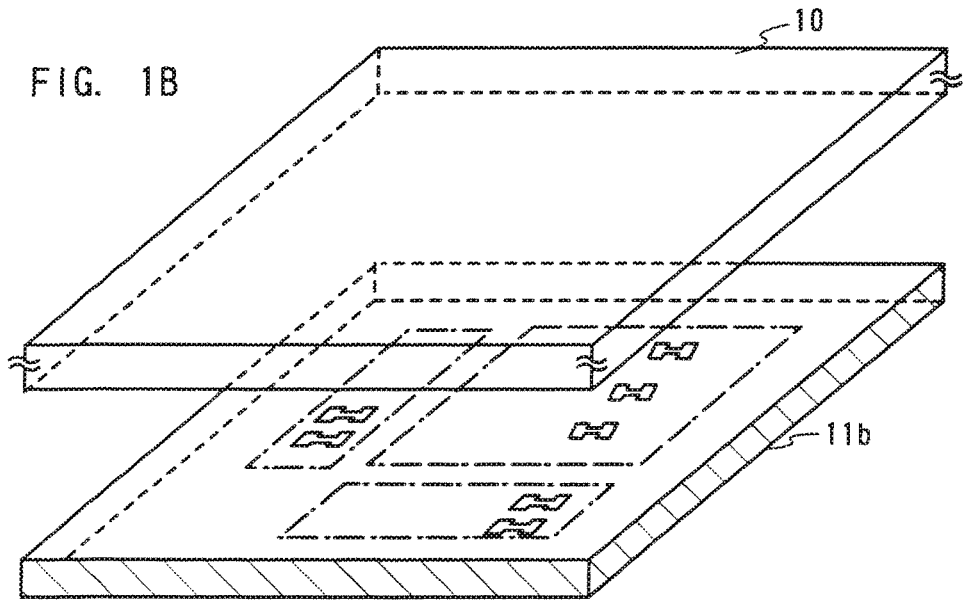

Thus, the layer to be peeled 11b which is formed on the oxide layer can be separated from the substrate 10. A state obtained after peeling is shown in FIG. 1B. In a stage shown in FIG. 1B, not only the semiconductor layer but also electrodes, wirings, and the like are formed. However, for simplification, they are not shown here.

Figure 1C:
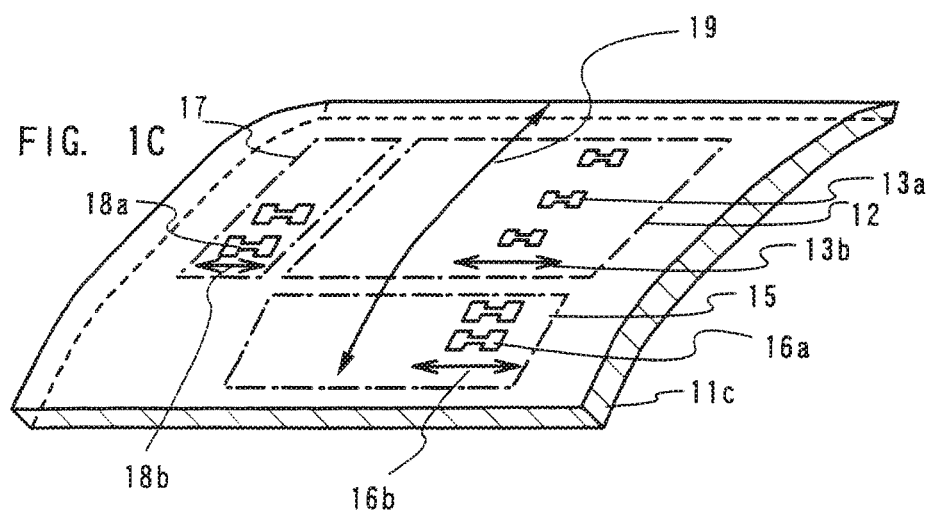

The peeled layer 11c can be bent. A state obtained after the bending is shown in FIG. 1C. The peeled layer 11c is bent in a bending direction 19. It is needless to say that the peeled layer can be bonded to a transfer body (not shown) having a curved surface.

In FIG. 1C, reference numeral 15 denotes a driver circuit (X-direction), 16a denotes a semiconductor layer provided in the driver circuit (X-direction), 16b denotes a channel length direction of the semiconductor layer 16a, 17 denotes a driver circuit (Y-direction), 18a denotes a semiconductor layer provided in the driver circuit (Y-direction), and 18b denotes a channel length direction of the semiconductor layer 18a.

Thus, the maximum feature of the present invention is that the laser light irradiation direction 14b and the channel length directions 13b, 16b, and 18b of all the semiconductor layers provided in the layer to be peeled are set to be the same direction, and these directions and a bending direction 19 are set to be orthogonal to each other.

Figure 2:
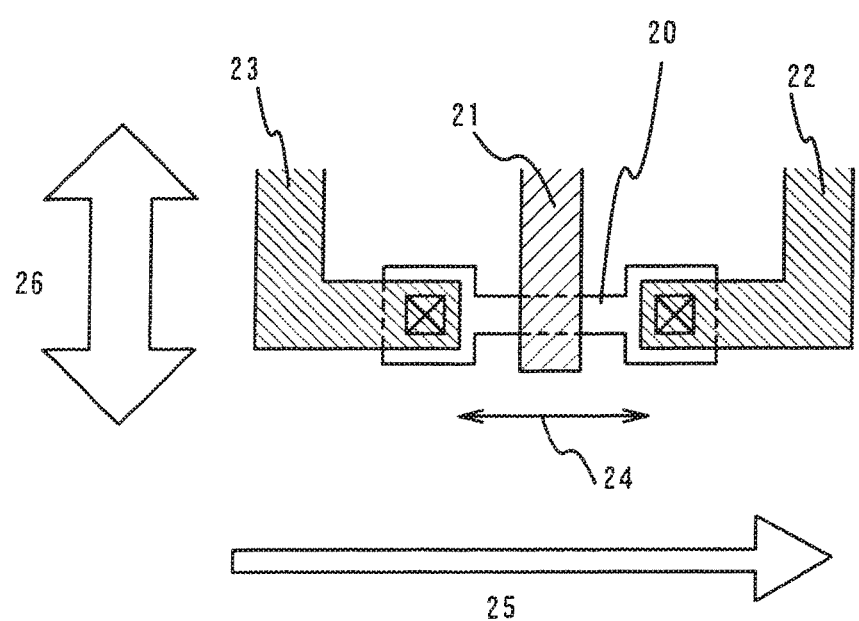
FIG. 2 is a diagram indicating directional orientations in an embodiment mode of the present invention.

Note that, in order to further clear a correlation among these directions, the case where a TFT is noted is shown in FIG. 2. FIG. 2 briefly shows a TFT having a semiconductor layer 20, a gate electrode 21, and electrodes (source electrode and drain electrode) 22 and 23. Note that the TFT can be produced as follows by using a known technique. First, a semiconductor film having an amorphous structure (made of amorphous silicon or the like) is crystallized by a known crystallization technique to produce a semiconductor film having a crystalline structure (made of polysilicon or the like), and then patterned into a predetermined shape to form the semiconductor layer 20. Next, the semiconductor layer 20 is covered with a gate insulating film (not shown) and then the gate electrode 21 is formed so as to partially overlap the semiconductor layer 20 through the insulating film interposed therebetween. After that, an impurity element for imparting an n-type or p-type conductivity is added to a portion of the semiconductor layer to produce a source region and a drain region, an interlayer insulating film (not shown) covering the gate electrode is formed, and the electrodes (source electrode and drain electrode) 22 and 23 electrically connected with the source region and the drain region are formed on the interlayer insulating film.

In the present invention, laser light whose scanning direction is a scanning direction 25 shown in FIG. 2 is used for manufacturing the TFT. In addition, a portion of the semiconductor layer 20 which is overlapped with the gate electrode 21 through the gate insulating film interposed therebetween serves as a channel. Thus, a channel length direction becomes a channel length direction 24 shown in FIG. 2. The scanning direction 25 of laser light becomes the same direction as the channel length direction 24. In addition, a channel width direction which is a direction orthogonal to the channel length direction 24 is the same direction as a bending direction. The bending direction becomes a bending direction 26 shown in FIG. 2. Note that the example of a top gate TFT is shown in FIG. 2. The present invention can be applied to, for example, a bottom gate (inverse staggered) TFT or a staggered TFT independent on the TFT structure.

Although a TFT in which a semiconductor layer containing silicon serves as an active layer is shown here, but it is not limited to such a TFT particularly. It is also possible to manufacture an organic TFT in which an active layer is made of an organic material. Materials for the active layer of an organic TFT can be a material having considerable amount of carbon when it is combined with other materials, or a material containing an isotope of carbon element except diamond. As representative materials of the active layer of an organic TFT, $C_{60}$, $C_{70}$, thiophene polymer, thiophene substitution derivatives, poly (thienylene vinylene) and the like can be exemplified.

Also, the present invention can be applied to various manufacturing methods of semiconductor device. Particularly, when a plastic substrate is used for the transfer body and the support member, weight reduction can be realized.

When a liquid crystal display device is manufactured, it is preferable that the support member is used as a counter substrate and bonded to the layer to be peeled using a sealing member as a bonding layer. In this case, the element provided to the layer to be peeled has a pixel electrode. A liquid crystal material is filled into a space between the pixel electrode and the counter substrate. In addition, an order for manufacturing the liquid crystal display device is not particularly limited. For example, the counter substrate as the support member is bonded to the layer to be peeled which is provided to the substrate, a liquid crystal material is injected therebetween, and then the substrate is peeled and the plastic substrate as the transfer body is bonded to the layer to be peeled. Alternatively, after the pixel electrode is formed, the substrate is peeled, the plastic substrate as a first transfer body is boned to the layer to be peeled, and then the counter substrate as a second transfer body is bonded thereto.

Also, when a light emitting device represented by a device having a light emitting element in which a layer containing an organic compound serves as a light emitting layer is manufactured, it is preferable that the support member is used as a sealing member. Thus, a light emitting element is completely shielded from external so as to prevent entrance of a substance such as moisture or oxygen for promoting deterioration of an organic compound layer from external. In addition, when the light emitting device represented by the device having a light emitting element in which a layer containing an organic compound serves as a light emitting layer is manufactured, as in the case of the support member, it is preferable that the transfer body sufficiently prevents entrance of a substance such as moisture or oxygen for promoting deterioration of an organic compound layer from external. In addition, an order for manufacturing the light emitting device is not particularly limited. For example, after the light emitting element is formed, a plastic substrate as the support member is bonded to the layer to be peeled which is provided to a substrate, the substrate is peeled, and a plastic substrate as the transfer body is bonded to the layer to be peeled. Alternatively, after the light emitting element is formed, the substrate is peeled, a plastic substrate as a first transfer body is boned to the layer to be peeled, and then a plastic substrate as a second transfer body is bonded thereto. In addition, when it is important to suppress the deterioration occurring due to transmission of moisture or oxygen, a thin film is formed in contact with the layer to be peeled after peeling to repair a crack caused at peeling. When a film having thermal conductivity, specifically, an aluminum nitride or an aluminum oxynitride is used as the thin film which is in contact with the layer to be peeled, in addition to an effect for radiating heat generated in the element to suppress the deterioration thereof, an effect for preventing deformation or degradation of, the transfer body, specifically, a plastic substrate can be obtained. In addition, the film having thermal conductivity has an effect for preventing mixing of an impurity such as moisture or oxygen from external.

The present invention made by the above constitutions will be described in more detail through the following embodiments.

Embodiment 1

Here, an example of laser processing apparatus applicable to the present invention will be described.

Crystallization of amorphous silicon by laser annealing is conducted through a melting-solidification process. More specifically, the case where it is divided into two stages, that is, a stage of generation of crystal nucleus and a stage of crystal growth from the nucleus is considered. However, in the case of laser annealing using a pulse laser beam, a generation position of crystal nucleus and a generation density thereof cannot be controlled but left to natural generation. Thus, a crystal grain is formed at an arbitrary position within the surface of a glass substrate and only a small size of about 0.2 µm to 0.5 µm is obtained. A large number of defects are caused in a crystal boundary. This is considered to be a factor limiting the field effect mobility of a TFT.

It is considered that a method of conducting crystallization with melting-solidification by continuous oscillation laser scanning is a method similar to a zone melting method. However, according to the method, a large beam size cannot be obtained. In addition, it is obvious that much time is required for achieving crystallization over the entire surface of a large area substrate.

In this embodiment, a laser processing apparatus for conducting laser beam irradiation with a state in which an irradiation position is substantially aligned with a position in which a TFT is produced, over the entire surface of a large area substrate for crystallization, so that a crystalline semiconductor film having a large grain size can be formed at high throughput will be described below.

As a laser irradiation apparatus of Embodiment 1, the following apparatus may be used. The laser irradiation apparatus includes a first movable mirror for deflecting a laser beam in a main scanning direction and a second movable mirror for receiving the laser beam deflected in the main scanning direction and conducting scanning in a sub scanning direction, which is a long shape. The second movable mirror has means for scanning a laser beam in the sub scanning direction at a rotation angle about the axis of the long shape direction as a center to irradiate the laser beam to an object to be processed which is placed on a stage.

Also, as another laser irradiation apparatus, the following apparatus may be used. That is, the laser irradiation apparatus includes a first laser beam scanning system and a second laser beam scanning system. The first laser beam scanning system has a first movable mirror for deflecting a laser beam in a first main scanning direction and a long second movable mirror for receiving the laser beam deflected in the first main scanning direction and conducting scanning in a first sub scanning direction. The second laser beam scanning system has a third movable mirror for deflecting a laser beam in a second main scanning direction and a long fourth movable mirror for receiving the laser beam deflected in the second main scanning direction and conducting scanning in a second sub scanning direction. The second movable mirror has means for scanning a laser beam in the first sub scanning direction at a rotation angle about the axis of the long shape direction as a center to irradiate the laser beam to an object to be processed which is placed on a stage. The fourth movable mirror has means for scanning a laser beam in the second sub scanning direction at a rotation angle about the axis of the long shape direction as a center to irradiate the laser beam to the object to be processed which is placed on the stage.

In the above configuration, a galvanomirror or a polygon mirror is applied to the first and second movable mirrors. A solid laser or a gas laser is preferably applied to a laser for providing the laser beam.

In the above configuration, a laser beam is scanned in the main scanning direction by the first movable mirror and scanned in the sub scanning direction by the second movable mirror. Thus, the laser beam can be irradiated in an arbitrary position onto the object to be processed. In addition, a plurality of such laser beam scanning means are provided and laser beams are irradiated to a surface to be formed in biaxial directions. Thus, a laser processing time can be shortened.

Hereinafter, a laser irradiation apparatus of this embodiment will be described with reference to the drawings.

Figure 3:
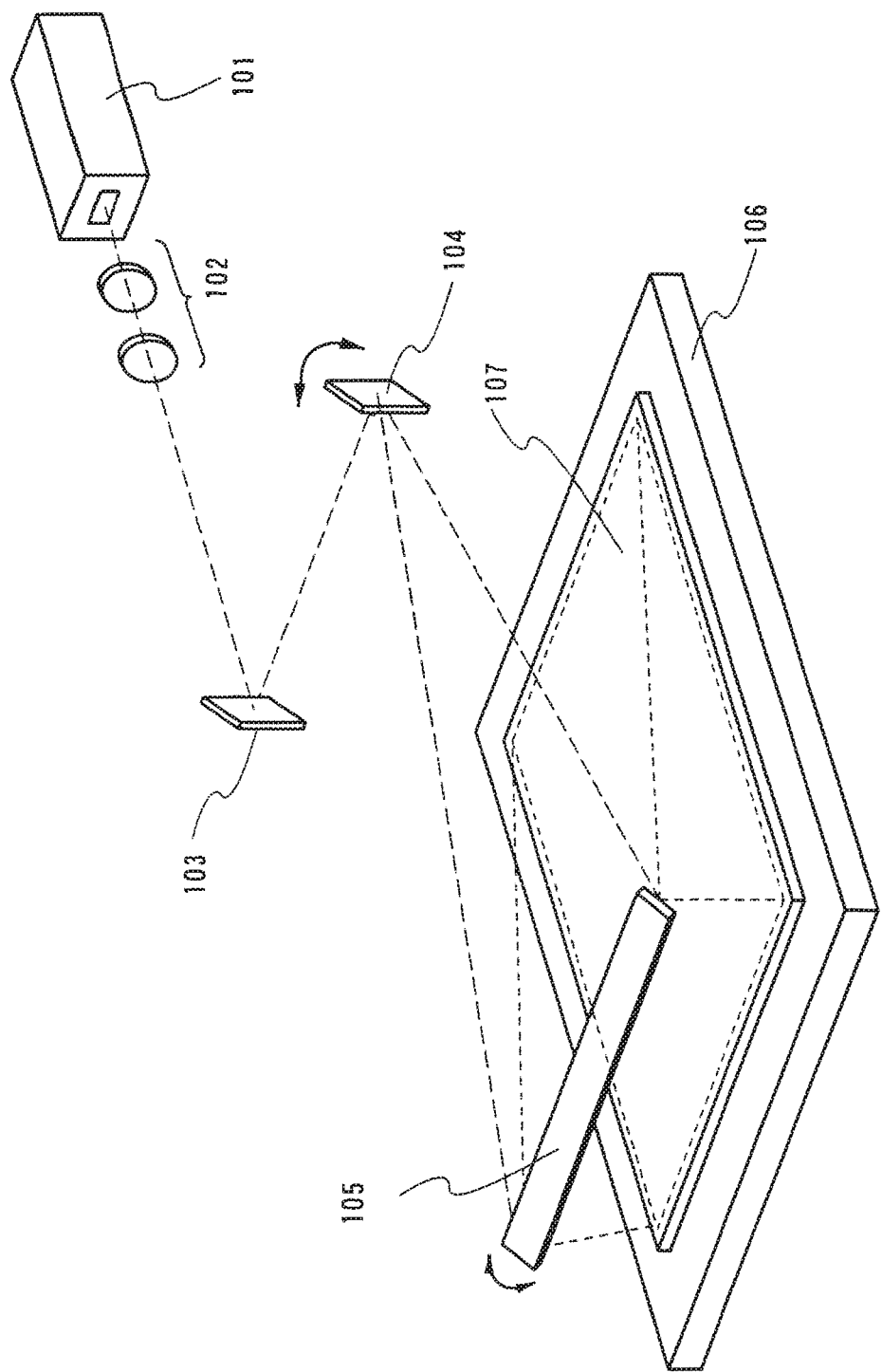
FIG. 3 is a layout diagram showing a configuration of a laser radiation device, according to Embodiment 1 of the present invention.

FIG. 3 shows a desirable example of a laser processing apparatus of this embodiment. The shown laser processing apparatus includes a solid laser 101 capable of conducting continuous oscillation or pulse oscillation, a lens such 102 as a collimator lens or a cylindrical lens for condensing a laser beam, a fixed mirror 103 for changing an optical path of the laser beam, a galvanomirror 104 for radially scanning the laser beam in a two-dimensional direction, and a movable mirror 105 for receiving the laser beam by the galvanomirror 104 and irradiating the laser beam toward a surface to be irradiated of a stage 106. An optical axis of the galvanomirror 104 and that of the movable mirror 105 are intersected each other and rotated in arrow directions shown in FIG. 3, respectively. Thus, a laser beam can be scanned over the entire surface of a substrate 107 placed on the stage 106. When the movable mirror 105 is used as an fθ mirror to correct an optical path difference, a beam shape on a surface to be irradiated can be also adjusted.

Figure 4:
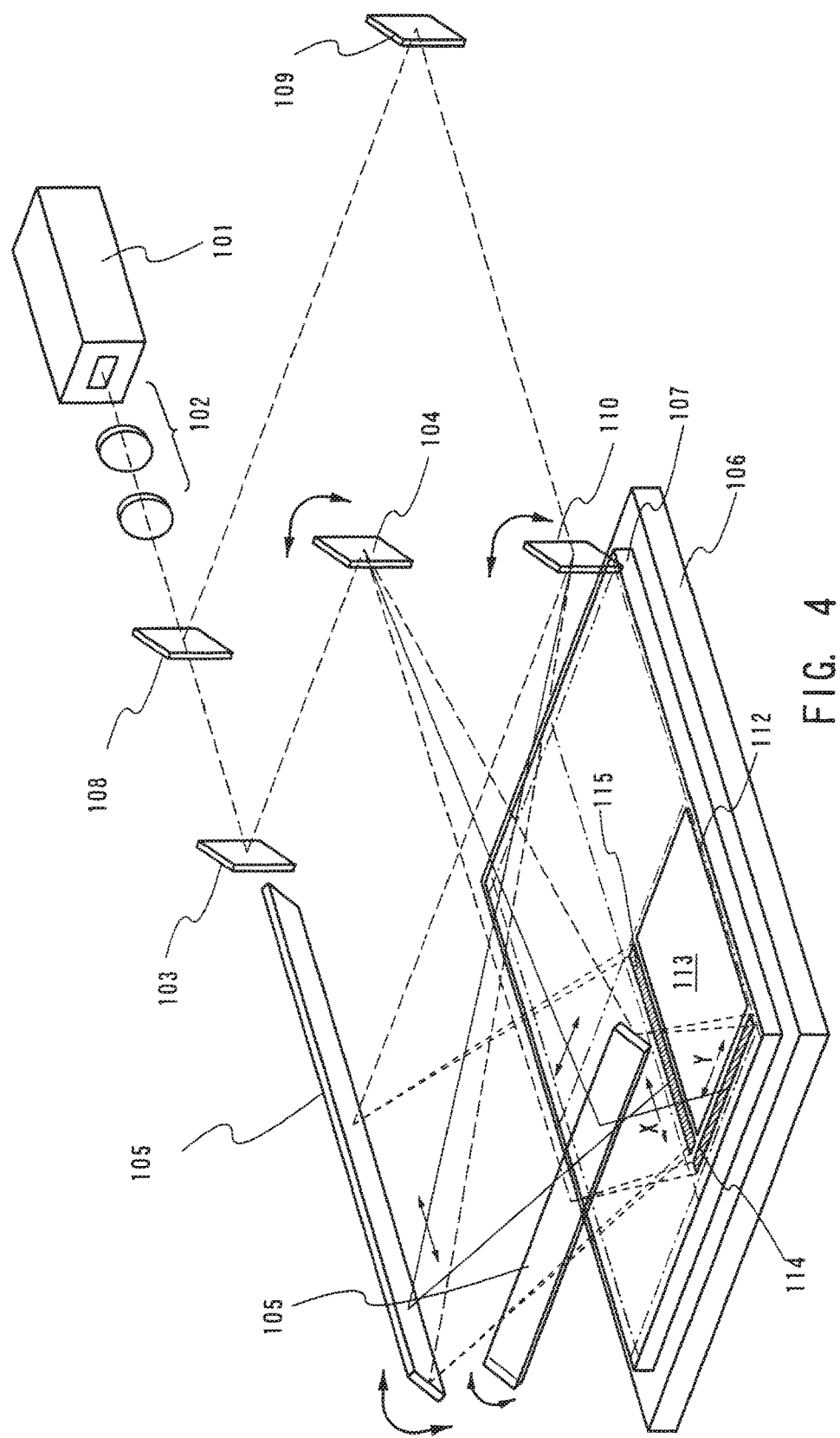
FIG. 4 is another layout diagram showing a configuration of a laser radiation device, according to Embodiment 1 of the present invention.

FIG. 3 shows a system for scanning a laser beam in a uniaxial direction of the substrate 107 placed on the stage 106 by the galvanomirror 104 and the movable mirror 105. As a more preferable configuration, as shown in FIG. 4, a half mirror 108, a fixed mirror 109, a galvanomirror 110, and a movable mirror 111 is added to the configuration shown in FIG. 3, and laser beams may be simultaneously scanned in biaxial directions (X- and Y-directions). A processing time can be shortened by using such a configuration. Note that the galvanomirrors 104 and 110 may be replaced by polygon mirrors.

A solid laser is preferable as the laser, and a solid laser using crystal such as YAG, YVO$_4$, YLF, or YAl$_5$O$_{12}$ which is doped with Nd, Tm, or Ho, or a semiconductor laser is preferably used. A fundamental wave of an oscillation wavelength is changed dependent on a doping material. An oscillation is produced at a wavelength of 1 µm to 2 µm. When a non-single crystalline semiconductor film is crystallized, in order to selectively absorb a laser beam by the semiconductor film, it is preferable that the second harmonic to the fourth harmonic of the oscillation wavelength is applied. Typically, in the case of crystallization of amorphous silicon, the second harmonic (532 nm) of an Nd:YAG laser (fundamental wave: 1064 nm) is used.

In addition, a gas laser such an argon laser, a krypton laser, or an excimer laser can be applied.

Also, an atmosphere at laser light irradiation may be an atmosphere containing oxygen, an atmosphere containing nitrogen, an inert atmosphere, or a vacuum and is preferably selected as appropriate according to a purpose.

An oscillation mode may be either pulse oscillation or continuous oscillation. In order to achieve continuous crystal growth with a molten state of the semiconductor film, it is desirable that a continuous oscillation mode is selected.

In the case where a TFT which is made from a semiconductor film crystallized by laser annealing is formed on a substrate, when a crystal growth direction is aligned with a carrier moving direction, high field effect mobility can be obtained. In other words, when the crystal growth direction is aligned with the channel length direction, the field effect mobility can be substantially increased.

When a continuous oscillating laser beam is irradiated to a non-single crystalline semiconductor film for crystallization, a solid-liquid interface is kept. Thus, a continuous crystal growth can be obtained in the scanning direction of the laser beam. As shown in FIG. 4, with respect to a TFT substrate (substrate to which TFTs are mainly formed) 112 used for manufacturing an active matrix liquid crystal display device which driver circuits are integrally formed, driver circuit portions 114 and 115 are provided in the vicinity of a pixel portion 113. FIG. 4 shows a configuration of a laser irradiation apparatus made in consideration of such a layout. As described above, in the case of the configuration in which laser beams are incident from the biaxial directions, laser beams can be synchronously or asynchronously irradiated in an X-direction and a Y-direction indicated by arrows in the drawing by a combination of the galvanomirrors 104 and 110 and the movable mirrors 105 and 111. In addition, it is possible that a location is designated according to the layout of TFTs and a laser beam is irradiated thereto.

Figure 5:
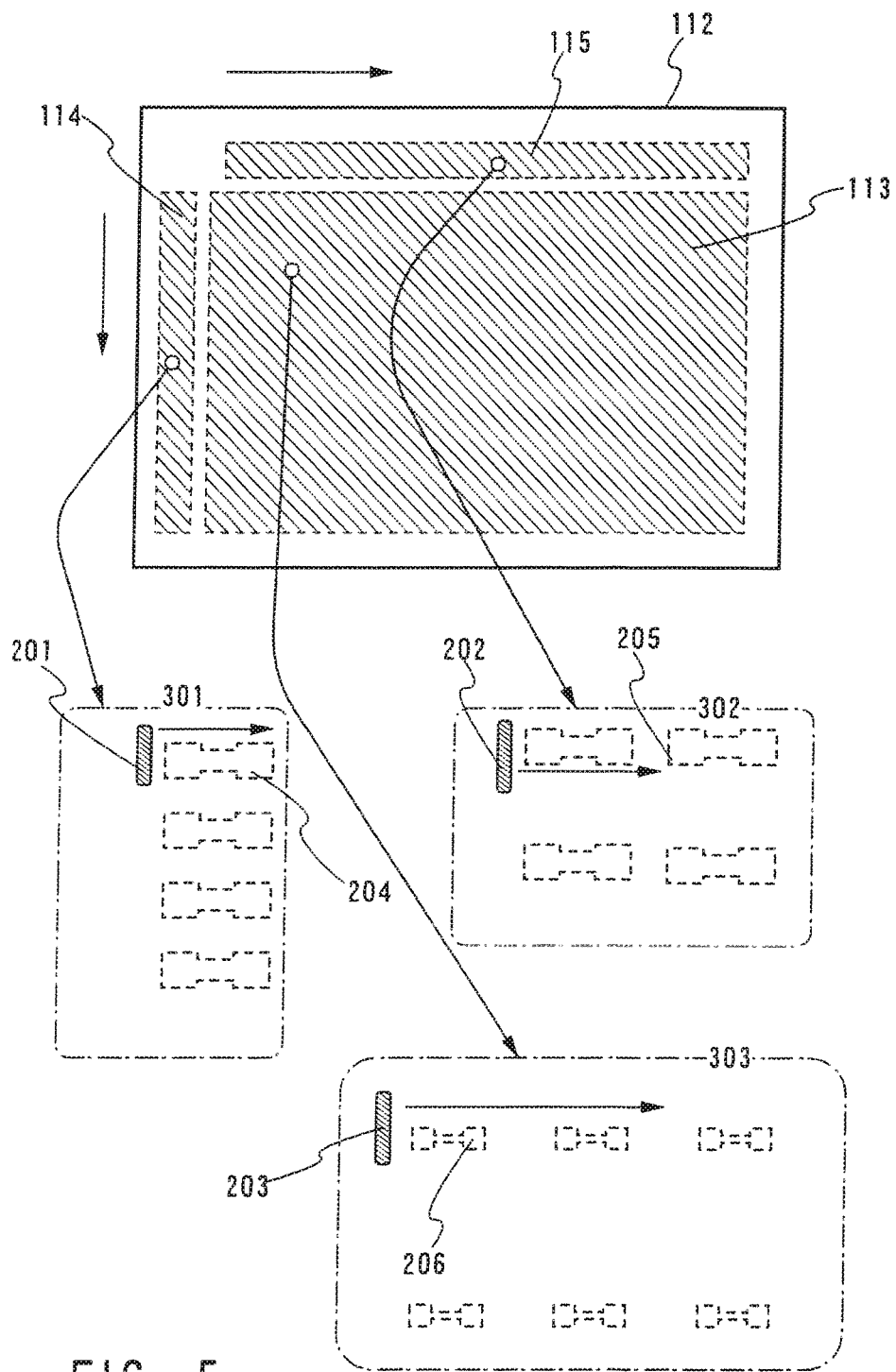
FIG. 5 is a diagram for explaining a construction of a substrate provided with a TFT, and the relationship between an arrangement of a semiconductor area constituting the TFT and a scan direction of a laser beam.

FIG. 5 shows a relationship between the substrate 112 to which TFTs are provided and an irradiation direction of a laser beam in detail. Regions in which the pixel portion 113 and the driver circuits 114 and 115 are formed are indicated by dot lines on the substrate 112. In a stage of crystallization, a non-single crystalline semiconductor film is formed on the entire surface. Semiconductor regions for forming TFTs can be designated by alignment makers or the like formed in end portions of the substrate.

For example, the driver circuit portion 114 is a region for forming a scan line driver circuit. In its partially enlarged view 301, semiconductor regions 204 of TFTs and a scanning direction of a laser beam 201 are indicated. The semiconductor regions 204 having an arbitrary shape can be applied. In any case, the channel length direction is aligned with the scanning direction of the laser beam 201. In addition, the driver circuit portion 115 extended in a direction in which it intersects the driver circuit portion 114 is a region for forming a data line driver circuit, and an arrangement of semiconductor regions 205 is aligned with a scanning direction of a laser beam 202 (enlarged view 302). Similarly, in the case of the pixel portion 113, as shown in an enlarged view 303, an arrangement of no semiconductor regions 206 is aligned and a laser beam 202 is scanned in a channel length direction. The scanning direction of the laser beam is not limited to a single direction and round trip scanning may be conducted.

Next, steps of crystallizing a non-single crystalline semiconductor film and producing a TFT from the formed crystalline semiconductor film will be descried with reference to FIGS. 6A to 6D. FIG. 6B is a longitudinal cross sectional view. A non-single crystalline semiconductor film 403 is formed on a glass substrate 401. A typical example of the non-single crystalline semiconductor film 403 is an amorphous silicon film. In addition, an amorphous silicon germanium film or the like can be applied. The thickness of 10 nm to 20 nm can be applied and may be further increased in accordance with a wavelength of a laser beam and an energy density thereof. In addition, it is desirable to employ such a measure that a blocking layer 402 is provided between the glass substrate 401 and the non-single crystalline semiconductor film 403 so as not to diffuse an impurity such as alkali metal from the glass substrate into the semiconductor film. A silicon nitride film, a silicon oxynitride film, or the like is applied as the blocking layer 402.

Also, a laminate 409 of a metallic layer or a metallic nitride layer and an oxide layer is formed between the blocking layer 402 and the substrate 401 for peeling. As the metallic layer or the nitride layer, there is preferably used a nitride comprising a single layer made of an element selected from Ti, Al, Ta, W, Mo, Cu, Cr, Nd, Fe, Ni, Co, Ru, Rh, Pd, Os, Ir, and Pt, or an alloy material or a compound material which contains the above element as a main ingredient, or a laminate of those. For example, a single layer made of titanium nitride, tungsten nitride, tantalum nitride, or molybdenum nitride, or a laminate of those is preferably used. Here, a titanium nitride film having a film thickness of 100 nm which is formed by a sputtering method is used. Note that, when a contact property to the substrate is low, a buffer layer is preferably provided. A single tungsten layer and a tungsten nitride have a high contact property and are exemplified as preferable materials. In addition, as the oxide layer, a single layer made of a silicon oxide material or a metallic oxide material, or a laminate of those is preferably used. Here, a silicon oxide film having a film thickness of 200 nm which is formed by a sputtering method is used. Bonding force between the metallic nitride layer and the oxide layer has a sufficient strength to withstand heat treatment Thus, film peeling (which is also called peeling) or the like is not caused. However, peeling can be simply performed in an inner portion of the oxide layer or a boundary thereof by a physical means. Note that a glass substrate is used here. However, various substrates can be used in the above peeling method. As the substrate 401, a quartz substrate, a ceramic substrate, a silicon substrate, a metallic substrate, or a stainless steel substrate may be used.

Next, crystallization is conducted by irradiation of a laser beam 400. Thus, a crystalline semiconductor film 404 can be formed. As shown in FIG. 6A, the laser beam 400 is scanned to a position of a semiconductor region 405 where a TFT will be formed. A beam shape can be set to be an arbitrary shape such as a rectangular shape, a linear shape, or an elliptical shape. With respect to the laser beam condensed by an optical system, an energy intensity at a central region thereof is not necessarily equal to that at an edge region. Thus, it is desirable that the semiconductor region 405 is not overlapped with the edge region of the beam.

Scanning of the laser beam is not limited to scanning in only a single direction and round trip scanning may be conducted. In this case, a laser energy density is changed every time scanning is conducted. Thus, a stepwise crystal growth can be produced. The scanning can also serve as dehydrogenation processing which is often required in the case of crystallization of amorphous silicon. For example, first scanning is conducted at a low energy density to release hydrogen, and then second scanning is conducted at an increased energy density to complete the crystallization.

When continuous oscillation laser beam irradiation is conducted in such a laser beam irradiation method, the growth of crystal having a larger grain size is possible. Of course, in order to realize this, it is necessary to set parameters such as a scanning speed of a laser beam and an energy density thereof in detail as appropriate. When the scanning speed is set to 10 cm/sec to 80 cm/sec, the above crystal growth can be realized. It is said that a speed of crystal growth through melting-solidification using a pulse laser is 1 m/sec. If a laser beam is scanned at a speed lower than the crystal growth speed and slow cooling is conducted, continuous crystal growth in a solid-liquid interface is possible. Thus, an increase in a grain size of crystal can be realized.

According to the laser irradiation apparatus of this embodiment, under such a situation, it is possible that a position on the substrate is arbitrarily designated and laser beam irradiation is conducted for crystallization. When laser beam irradiation is conducted from biaxial directions, a throughput can be further improved.

Also, when laser beam irradiation is conducted, clean peeling from the substrate can be performed with smaller force. Thus, a layer to be peeled that has a large area can be peeled over the entire surface thereof.

In order to further promote peeling, a granular oxide (for example, ITO (alloy of indium oxide and tin oxide), an alloy of indium oxide and zinc oxide ($In_2O_3$—ZnO), a zinc oxide (ZnO) or the like) may be provided in an interface between the nitride layer, the metallic layer, or the metallic nitride layer and the oxide layer.

Then, as shown in FIGS. 6C and 6D, the formed crystalline semiconductor film is etched to form a semiconductor region 405 in an island-shape. In the case of a top gate TFT, a gate insulating film 406, a gate electrode 407, and impurity regions 408 having a conductivity type are formed on the semiconductor region 405 to produce a TFT. Then, wirings, an interlayer insulating film, and the like are preferably formed as appropriate by a known technique to produce an element.

Thus, after obtaining the element having the TFT, the substrate 401 is peeled in accordance with the embodiment mode. In this embodiment, a resultant layer formed on the blocking layer 402 corresponds to the layer to be peeled 11b which is described in the embodiment mode. When the mechanical strength of the layer to be peeled is insufficient, it is preferable that the substrate is peeled after a support member (not shown) for fixing the layer to be peeled is bonded thereto.

The layer to be peeled which is formed on the oxide layer can be simply separated from the substrate by peeling. The peeled layer can be bent in a certain direction. It is needless to say that the layer to be peeled can be bonded to a transcriptional body (not shown) having a curved surface.

Also in this embodiment, according to the present invention, the irradiation direction (scanning direction) of the laser light and the channel length directions of all semiconductor layers 204 to 206 and 405 provided to the layer to be peeled are set to be the same direction, and these directions and the bending direction are set to be orthogonal to each other. Thus, a display having a curved surface can be realized.

Also, this embodiment can be freely combined with the embodiment mode.

Embodiment 2

The example of the top gate TFT is descried in Embodiment 1. Here, an example of a bottom gate TFT will be described. Also, the structure except for the TFT is the same one as Embodiment 1 and the description is thereof omitted here.

Next, steps of crystallizing a non-single crystalline semiconductor film and producing a TFT from the formed crystalline semiconductor film will be descried with reference to FIGS. 7A to 7D.

FIG. 7B is a longitudinal cross sectional view. A non-single crystalline semiconductor film 503 is formed on a gate insulating film 506 covering a gate electrode. A typical example of the non-single crystalline semiconductor film 503 is an amorphous silicon film. In addition, an amorphous silicon germanium film or the like can be applied. The thickness of 10 nm to 200 nm can be applied and may be further increased in accordance with a wavelength of a laser beam and an energy density thereof. In addition, it is desirable to employ such a measure that a blocking layer 502 is provided between the glass substrate 501 and the gate electrode so as not to diffuse an impurity such as alkali metal from the glass substrate into the semiconductor film. A silicon nitride film, a silicon oxynitride film, or the like is applied as the blocking layer 502.

Also, a laminate 509 of a metallic layer or a metallic nitride layer and an oxide layer is formed between the blocking layer 502 and the substrate 501 for peeling. As the metallic layer or the nitride layer, there is preferably used a nitride comprising a single layer made of an element selected from Ti, Al, Ta, W, Mo, Cu, Cr, Nd, Fe, Ni, Co, Ru, Rh, Pd, Os, Ir, and Pt, or an alloy material or a compound material which contains the above element as a main ingredient, or a laminate of those is preferably used. For example, a single layer made of titanium nitride, tungsten nitride, tantalum nitride, or molybdenum nitride, or a laminate of those is preferably used. Here, a titanium nitride film having a film thickness of 100 nm which is formed by a sputtering method is used. Note that, when a contact property to the substrate is low, a buffer layer is preferably provided. A single tungsten layer and a tungsten nitride have a high contact property and are exemplified as preferable materials. In addition, as the oxide layer, a single layer made of a silicon oxide material or a metallic oxide material, or a laminate of those is preferably used. Here, a silicon oxide film having a film thickness of 200 nm which is formed by a sputtering method is used. Bonding force between the metallic nitride layer and the oxide layer has a strength resistant to heat treatment. Thus, film peeling (which is also called peeling) or the like is not caused. However, peeling can be simply performed in an inner portion of the oxide layer or a boundary thereof by a physical means.

Next, crystallization is conducted by irradiation of a laser beam 500. Thus, a crystalline semiconductor film 504 can be formed. The laser beam is obtained from the laser processing apparatus described in Embodiment 1. As shown in FIG. 7A, the laser beam 500 is scanned to a position of a semiconductor region 505 where a TFT will be formed. A beam shape can be set to be an arbitrary shape such as a rectangular shape, a linear shape, or an elliptical shape. With respect to the laser beam condensed by an optical system, an energy intensity at a central region thereof is not necessarily equal to that at an edge region. Thus, it is desirable that the semiconductor region 505 is not overlapped with the edge region of the beam.

Scanning of the laser beam is not limited to scanning in only a single direction and round trip scanning may be conducted. In this case, a laser energy density is changed every time scanning is conducted. Thus, a stepwise crystal growth can be produced. The scanning can also serve as dehydrogenation processing which is often required in the case of crystallization of amorphous silicon. For example, first scanning is conducted at a low energy density to release hydrogen, and then second scanning is conducted at an increased energy density to complete the crystallization.

When continuous oscillation laser beam irradiation is conducted in such a laser beam irradiation method, the growth of crystal having a larger grain size is possible. Of course, in order to realize this, it is necessary to set parameters such as a scanning speed of a laser beam and an energy density thereof in detail as appropriate. When the scanning speed is set to 10 cm/sec to 80 cm/sec, the above crystal growth can be realized. It is said that a speed of crystal growth through melting-solidification using a pulse laser is 1 m/sec. If a laser beam is scanned at a speed lower than the crystal growth speed and slow cooling is conducted, continuous crystal growth in a solid-liquid interface is possible. Thus, an increase in a grain size of crystal can be realized.

Also, when laser beam irradiation is conducted, clean peeling from the substrate can be performed with smaller force. Thus, a layer to be peeled that has a large area can be peeled over the entire surface thereof.

In order to further promote peeling, a granular oxide (for example, ITO (alloy of indium oxide and tin oxide), an alloy of indium oxide and zinc oxide ($In_2O_3$—ZnO), a zinc oxide (ZnO) or the like) may be provided in an interface between the nitride layer, the metallic layer, or the metallic nitride layer and the oxide layer.

Then, as shown in FIGS. 7C and 7D, the formed crystalline semiconductor film is etched to form a semiconductor region 505 in an island-shape. Here, an etching stopper is provided on a semiconductor region 505, and impurity regions 508 having one conductivity type are formed to produce a TFT. Then, wirings, an interlayer insulating film, and the like are preferably formed as appropriate by a known technique to produce an element.

Thus, after obtaining the element having the TFT, substrate 501 is peeled in accordance with the embodiment mode. In this embodiment, a resultant layer formed on the blocking layer 502 corresponds to the layer to be peeled 11b which is described in the embodiment mode. When the mechanical strength of the layer to be peeled is insufficient, it is preferable that the substrate is peeled after a support member (not shown) for fixing the layer to be peeled is bonded thereto.

The layer to be peeled which is formed on the oxide layer can be simply separated from the substrate by peeling. The peeled layer can be bent in a certain direction. It is needless to say that the layer to be peeled can be bonded to a transfer body (not shown) having a curved surface.

Even in this embodiment, the irradiation direction (scanning direction) of the laser light and the channel length directions of the semiconductor layer 505 provided to the layer to be peeled are set to be the same direction, and these directions and the bending direction are set to be orthogonal to each other. Thus, a display having a curved surface can be realized.

Also, this embodiment can be freely combined with the embodiment mode.

Embodiment 3

In accordance with the present embodiment, FIG. 8 shows a technique for transferring a layer to be peeled containing TFT.

In FIGS. 8A to 8G, reference numeral 830 indicates a first substrate; reference numeral 831 indicates a first material layer composed of a nitride layer or a metallic layer; reference numeral 832 indicates a second material layer composed of an oxide layer; reference numeral 833 indicates a layer to be peeled; reference numeral 834 indicates a first adhesive; reference numeral 835 indicates a second substrate; reference numeral 836 indicates a second adhesive; and reference numeral 837 indicates a third substrate.

In accordance with the present embodiment, the first substrate 830 may be constituted by a glass substrate, a quartz substrate, a ceramic substrate or the like. Further, it is also possible to use a semiconductor substrate such as a silicon substrate, or a metallic substrate such as a stainless steel substrate. Here, a glass substrate (#1737) having a thickness of 0.7 mm is used.

Figure 8A:
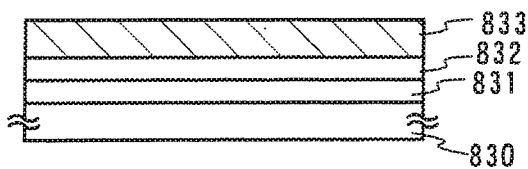
FIGS. 8A to 8G are diagrams of steps illustrating Embodiment 3 of the present invention.
Figure 8B:
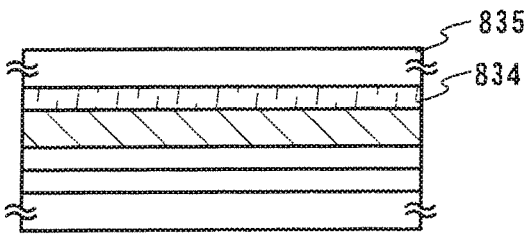

First, as shown in FIG. 8A, on top of the substrate 830, the first material layer 831 is formed. The first material layer 831 may be a material which, immediately after the film is formed, exhibits one of compression stress and tension stress. However, it is important to use a material in which abnormalities such as peeling due to thermal processing and laser light radiation, in the forming of the layer to be peeled, do not occur, and which exhibits tension stress in a range of 1 to $1 \times 10^{10}$ (Dyne/cm$^2$) after the forming of the layer to be peeled. A representative example is a single layer constituted by an element selected from the group consisting of W, WN, TiN, and TiW, or by an alloy metal or compound material having the element as its main component, or a laminate thereof. Note that, the first material layer 831 may be formed using a sputtering method.

Next, the second material layer 832 is formed on top of the first material layer 831. In the second material layer 832, it is important to use a material in which abnormalities such as peeling caused by the thermal processing and the laser light radiation, in the forming of the layer to be peeled, do not occur, and which exhibits compression stress in a range of 1 to $1 \times 10^{10}$ (Dyne/cm$^2$) after the forming of the layer to be peeled. Representative examples of the second material layer include oxide silicon, oxide silicon nitride, oxide metallic material, and a laminate of these. Note that, the second material layer 832 may be formed using a sputtering method. In the case where the second material layer 832 is formed using the sputtering method, an inert gas such as argon gas is introduced into the chamber, to include a minute amount of Argon gas elements into the second material layer 832.

Regarding the first material layer 831 and the second material layer 832, the film widths of each of the layers is set as needed within a range of 1 nm to 1000 nm, to thereby adjust the internal stress of the first material layer 831 and the internal stress of the second material layer 832.

Further, in FIGS. 8A to 8G, in order to streamline the process, an example has been shown in which the first material layer 831 is formed in contact with the substrate 830. However, an insulating layer or metallic layer serving as a buffer may be provided in between the substrate 830 and the first material layer 831 to improve the adhesion with the substrate 830.

Next, the layer to be peeled is formed onto the second material layer 832. (See FIG. 8A). The layer to be peeled 833 may contain various elements (e.g., a film transistor, light emitting elements in which a layer containing organic compounds serves as a light emitting layer, elements containing liquid crystals, a memory element, a thin-film diode, a photoelectric conversion element formed by a silicon pin junction, or a silicon resistor element). However, in the case of elements containing liquid crystals, the layer to be peeled 833 must include a substrate which opposes it. Further, the process of forming the layer to be peeled 833 can be accomplished by thermal processing conducted within the temperature range that the first substrate 830 can withstand. Note that, even if the internal stress in the second material layer 832 and the internal stress in the first material layer 831 are different than each other, the thermal processing in the manufacturing of the layer to be peeled 833 will not cause peeling to occur.

Next, a process is performed for partially reducing the adhesion between the first material layer 831 and the second material layer 832. The processing for partially reducing the adhesion is a process in which a laser light is partially radiated on the first material layer or on the second material layer along the perimeter of the region to be peeled, or is a process in which localized pressure is applied from the outside along the perimeter of the region to be peeled to apply damage to a part of the inside or the surface of the second material layer. Specifically, a diamond or other such hard needle may be pressed perpendicularly and moved while applying pressure. Preferably, a scriber device is used and is pressed down by an amount of 0.1 mm to 2 mm, with pressure being applied as it is moved. In this way, before performing the peeling, it is important to create a portion where peeling can occur easily, which serves as a starter. By performing the preprocessing in which the selective (partial) reduction of the adhesion takes place, defective peelings are eliminated and yield is improved.

Next, the second substrate 835 and the layer to be peeled 833 are adhered to each other using the first adhesive 834. (See FIG. 8B). The first adhesive 834 may be a reactive-curing type adhesive, a thermal-curing type adhesive, an ultraviolet-curing type adhesive or other such photo-curing type adhesive, or may be an aerophobic-type adhesive, or other various types of curing adhesive. Moreover, these adhesives may be soluble such that they dissolve in a solvent, and/or may be photosensitive such that their adhesiveness decreases when irradiated with light. The composition of these adhesives may be, for example, epoxy-type, acrylic-type, silicon-type or anything else. The application of the adhesive may be carried out by a coating method, for example. Note that, the first adhesive is removed in subsequent steps. Here, a soluble adhesive material which can dissolve in a solvent is used as the first adhesive.

Further, instead of the first adhesive 834, a tape having adhesive on one or both of its surfaces may be used. The tape may include on one or both of its surfaces an adhesive which is soluble so as to dissolve in a solvent, or is photosensitive so as to lose adhesiveness when irradiated with light.

The second substrate 835 may be constituted by a glass substrate, a quartz substrate, a ceramic substrate, a plastic substrate or the like. Further, it is also possible to use a semiconductor substrate such as a silicon substrate, or a metallic substrate such as a stainless steel substrate.

The present embodiment employs a highly rigid quartz substrate (thickness: 1.1 mm) for the second substrate 835, having a thickness larger than the first substrate 830. In the case where a plastic film is used for the second substrate, when the elements formed onto the first substrate 830 are transferred onto the plastic film—which is to say when the layer to be peeled 833 and the film are adhered to each other by the first adhesive 834 and the film is lifted up—there was a risk that the film will bend and cause cracks to form in the layer to be peeled 833. Therefore, after fixing the layer to be peeled 833 formed over the first substrate 830 to the rigid second substrate 835 with the first adhesive 834, the first substrate 830 is peeled. Then, after the plastic film (i.e., the third substrate 837) is fixed to the layer with the second adhesive 836, the second substrate 835 is removed. By following this procedure, it becomes difficult for cracks to occur.

Figure 8C:
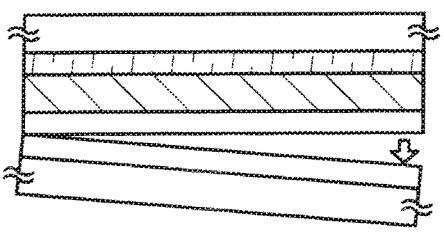

Next, peeling is performed from the above-mentioned region where the adhesiveness has been reduced, and the first substrate 830 having the first material layer 831 is separated by using a physical means (FIG. 8C). Since the second material layer 832 exhibits compressional stress and the first material has tension stress, the separation can be achieved with relatively little force (such as the force of a human hand, or wind pressure of gas blown from a nozzle, or ultrasonic waves, etc.).

Figure 8D:
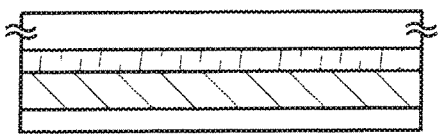

Thus, the layer to be peeled 833 formed onto the second material layer 832 can be separated from the first material layer 830. FIG. 8D shows the post-peeled state.

Next, the third substrate 837 and the second material layer 832 (and the peeled layer 833) are adhered together with the second adhesive 836. (See FIG. 8E). It is important that the second adhesive 836 has greater adhesive force than the first adhesive 834.

The second adhesive 836 may be a reactive-curing type adhesive, a thermal-curing type adhesive, an ultraviolet-curing type adhesive or other such photo-curing type adhesive, or may be an aerophobic-type adhesive, or other various types of curing adhesive. Moreover, these adhesives may be soluble such that they dissolve in a solvent, and/or may be photosensitive such that their adhesiveness decreases when irradiated with light. The composition of these adhesives may be, for example, epoxy-type, acrylic-type, silicon-type or anything else. The application of the adhesive may be carried out by a coating method, for example. Note that, the second adhesive becomes one support for the layer to be peeled at a subsequent step. For the second adhesive 836, a material is used which will achieve a high degree of adhesion between the third substrate and the second adhesive, and also between the second adhesive and the layer to be peeled. Here, an ultraviolet-curing type adhesive is used for the second adhesive 836.

Further, in the case where the second adhesive 836 is made of a material which is soluble so as to dissolve in a solvent, or is photosensitive such that it loses adhesive strength when exposed to light, it becomes possible to peel the third substrate at a later step, and it is possible for only the second adhesive to serve as the support. Further, instead of the second adhesive 836, it is possible to use a tape having adhesive on one or both of its surfaces. The surface or surfaces of this tape may have an adhesive which is soluble so as to dissolve in a solvent, or photosensitive such that its adhesive strength decreases when the tape is exposed to light.

A flexible substrate may be used for the third substrate 837. The present embodiment employs a plastic film for the third substrate 837.

Figure 8E:
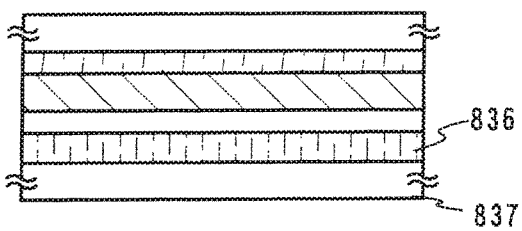
Figure 8F:
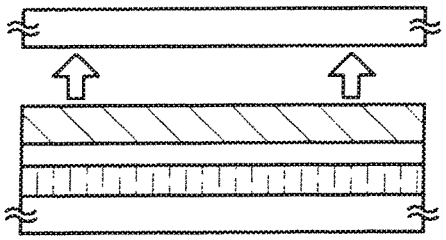

Once the situation shown in FIG. 8E is achieved, it is then soaked in the solvent and only the second substrate 835 is removed. (See FIG. 8F). Since the first adhesive is a soluble adhesive material, the second substrate 835 is removed easily, thus separating the second substrate 835 and the layer to be peeled 833.

Further, an input/output terminal of the element contained in the layer to be peeled 833 is formed so as to be exposed from the topmost layer (i.e., the layer closest to the second substrate side) of the layer to be peeled. Therefore, after the step of separating the second substrate, it is preferable that the first adhesive is completely removed from the surface of the layer to be peeled so that the input/output terminal portion can be exposed.

Further, in the present embodiment, there is shown the example in which the soluble adhesive material is used for the first adhesive 834 such that it dissolves in a solvent and in which the second substrate is soaked in the solvent and removed. However, the invention is not particularly restricted to this configuration. For example, a thermal-curing type adhesive (which loses adhesive strength when irradiated with ultraviolet light) may be used for the first adhesive, and ultraviolet rays may be radiated to thereby remove the second substrate.

Figure 8G:
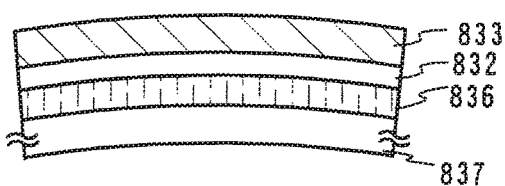

The steps described above enable the manufacture of a semiconductor device equipped with the layer to be peeled 833 which serves as a support for the second adhesive 836 and the third substrate 837. Then, by curving the device as shown in FIG. 8G, it thus becomes possible to achieve a semiconductor device in which the curved surface of the semiconductor device exhibits a radius of curvature of from 50 cm to 200 cm. When curving the device, it can be attached to the curved surface to which it is going to be mounted. Note that, between the second adhesive 836 and the layer to be peeled 833, there is the oxide layer 832 that is the second material layer. In the semiconductor device obtained as described above, the second material layer 832 is applied by a sputtering method and minute amounts of inert gas elements are included in the second material layer 832. Therefore, the semiconductor device as a whole can be made flexible.

Further, in accordance with the present embodiment, the device was curved after being attached to the third substrate. However, it is also possible to curve the device by attaching it directly to a base that has a curved surface, with the second adhesive 836.

Here, an example was shown in which the semiconductor device is built to completion according to the steps described above, but it is also possible to follow the above-mentioned steps to complete the semiconductor device only partially. For example, according to the above-mentioned steps, it is possible to form the layer to be peeled containing a TFT circuits, and then, after obtaining the layer to be peeled which has as a support therefor the second adhesive and the third substrate, steps of forming elements may be added to complete any of a variety of semiconductor devices, such as a light emitting device or a liquid crystal display device having a light emitting elements in which a layer containing an organic compound serves as a light emitting layer.

Further, it is also possible to make a light emitting device having a light emitting element in which a layer containing a passive organic element compound serves as a light emitting layer.

Further, in a case where, in order to reduce the adhesion between the third substrate and the second adhesive, a plastic film in which an $AlN_XO_Y$ film is formed on the surface is formed as the third substrate 837, it becomes possible to separate the second substrate 835 and the third substrate 837. It thus becomes possible to manufacture a semiconductor device equipped with the layer 833 to be peeled having the second adhesive 836 as a support. Since such a semiconductor device has only the second adhesive as a support, it can be made thin, lightweight and flexible.

Figure 9:
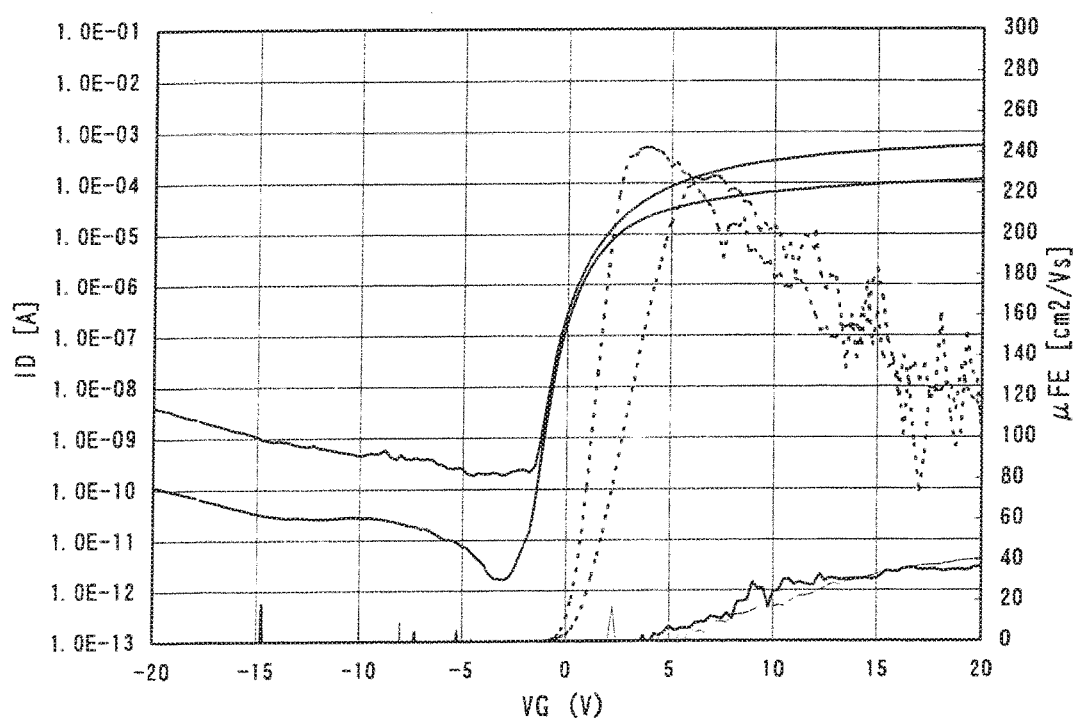
FIG. 9 is a diagram illustrating V-I characteristics of an n channel-type TFT after peeling.
Figure 10:
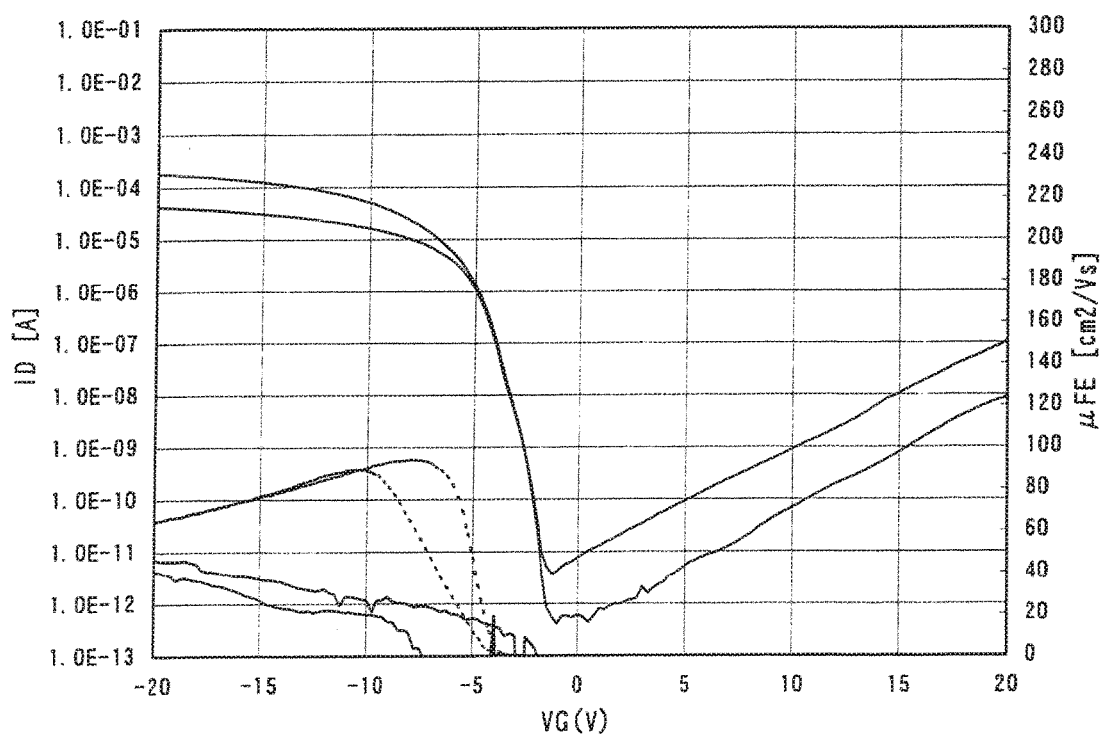
FIG. 10 is a diagram illustrating V-I characteristics of a p channel-type TFT after peeling.

Further, by following the above-mentioned steps, the present inventors actually performed electrical measurement of the TFT formed onto the first substrate before peeling the first substrate, and after separating the first and the second substrate, they performed the electrical measurement of the TFT once again. There was hardly any change in the characteristics of the TFT before and after separation. FIG. 9 is a V-I characteristic graph for an n-channel type TFT with the post-separation channel length L/channel width W=50 µm/50 µm. Further, FIG. 10 is a V-I characteristic graph for a p-channel type TFT with the post-separation channel length L/channel width W=50 µm/50 µm.

Since there was hardly any change in the characteristics of the TFT before and after the separation, it can be said that, even when the transferring and application are performed according to the sequence described above, the above-mentioned steps do not affect the TFTs. Further, it is also possible to directly form the TFT onto the plastic substrate; however, since the substrate's heat resistance is low, it would be difficult to perform thermal processing at 300° C. or higher. Thus, it would be difficult to form the TFT with the excellent characteristics shown in FIG. 9 and FIG. 10. As demonstrated in the present embodiment, after the TFT is formed onto the heat-resistant substrate, the heat-resistant substrate is then peeled. Accordingly, it thus becomes possible to form the TFT exhibiting the excellent characteristics as shown in FIG. 9 and FIG. 10.

Embodiment 4

In this embodiment, in accordance with the technology described in Embodiment 3, manufacturing steps of a light emitting device having a light emitting element in which a layer having an organic compound serves as a light emitting layer will be described with reference to FIG. 11.

First, pixel portions (n-channel TFTs and p-channel TFTs) and driver circuits (n-channel TFTs and p-channel TFTs) provided in the vicinity of the pixel portions are manufactured simultaneously on one substrate, organic light emitting elements (also called organic light emitting device) are formed thereon.

A first material layer 931 made of nitride layer or a metal layer and a second material layer 932 made of an oxide layer are formed on a first substrate in accordance with Embodiment 3.

Next, a layer containing TFTs and wirings is formed on the second material layer 932 in accordance with the technology shown in Embodiment 1. After an insulation film for covering respective TFT is formed, a cathode or an anode electrically connected with TFTs provided in the pixel portion is formed. Further, an insulator called bank is formed to cover the ends of the cathode or the anode on both ends thereof. Moreover, if necessary, it is practicable to form a passivation film (protection film) to cover TFTs optionally. And, an EL layer (organic compound material layer) and the anode or the cathode of organic light emitting elements are formed on the cathode or the anode both ends of which are covered by bank. When the under layer of the EL layer is a cathode, an anode can be provided on the EL layer, on the contrary, when the under layer of the EL layer is an anode, a cathode can be provided on the EL layer.

As the EL layer, an EL layer (layer for light emitting and making carrier perform the migrate for it) may be formed by freely combining the light emitting layer, a charge injection layer or a charge implantation layer. For example, low molecular system organic EL material and high molecular system organic EL material may be employed. Moreover, as an EL layer, a thin film out of a light emitting material (singlet compound) which light-emits (fluorescence) due to singlet excitation, or a thin film out of a light emitting material (triplet compound) which emits (phosphorescence) due to triplet excitation can be used. Moreover, an inorganic material such as silicon carbide or the like is capable of being used as a charge transport layer and a charge injection layer. For these organic EL material and inorganic material, the known materials can be used. In addition, the EL layer is totally formed in a thickness around 100 nm as a thin film layer. For this reason, it is necessary to enhance the evenness of the surface of the cathode or the anode.

As a material used for a cathode, it is said that it is preferable to use a metal having a small work function (representatively, metal elements belonging to I group or II group of the periodic table) or an alloy containing these. Since the smaller the work function is, the more the luminous efficiency is enhanced, it is preferable that among these, as a material used for a cathode, an alloy containing Li (lithium), which is one of alkaline metals, is used.

As a conductive film using for the anode, a material having a bigger working function in comparison with the material of the cathode such as ITO (indium oxide-tin oxide alloy), indium oxide-zinc oxide alloy ($In_2O_3$—ZnO), zinc oxide (ZnO) or the like may be used. Further, a material having a lower sheet resistance than ITO, specifically, platinum (Pt), chromium (Cr), tungsten (W), or nickel (Ni) may be used.

An organic light emitting layer is defined in this specification as an aggregate of layers formed between an anode and cathode of a light emitting element in which a layer containing an organic compound serves as a light emitting layer. Specifically, an organic light emitting layer includes a light emitting layer, a hole injecting layer, an electron injecting layer, a hole transporting layer, an electron transporting layer, etc. The basic structure of an organic light emitting element is a laminate of an anode, a light emitting layer, and a cathode layered in order. The basic structure may be modified into a laminate of an anode, a hole injecting layer, a light emitting layer, and a cathode layered in order, or a laminate of an anode, a hole injecting layer, a light emitting layer, an electron transporting layer, and a cathode layered in order.

A light emitting element in which a layer containing an organic compound serves as a light emitting layer has, in addition to an anode and a cathode, a layer containing an organic compound (light emitting material) that generates luminescence (electro luminescence) when an electric field is applied (the layer is hereinafter referred to a light emitting layer).

When a current flowing to the light emitting element is controlled by TFTs, there are two methods in a rough dividing way. Specifically, one method is controlling the current in a voltage region called saturation region, the other is controlling the current in a voltage region before reaching the saturation region. In this specification, a Vd region where a current value is substantial constant is referred to as a saturation region in Vd-Id curve. In addition, in the invention, there is no limitation putted on the driving methods of the light emitting element, that is to say, any driving methods can be used.

By the steps up through this point, the layer to be peeled is formed by laminating a layer 933b containing the light emitting element in which a layer containing an organic compound serves as a light emitting layer, and a layer 933a having TFTs and connected to the light emitting element. Since the light emitting element in which a layer containing an organic compound serves as a light emitting layer is weak against moisture and oxygen, immediately after the light emitting element in which a layer containing an organic compound serves as a light emitting layer is formed, using a substrate, a sealing can, and a sealant to seal it.

Next, a process is performed for partially reducing the adhesion between a first material layer 931 and a second material layer 932. The processing for partially reducing the adhesion is a process in which a laser light is partially radiated on the first material layer or on the second material layer along the perimeter of the region to be peeled, or is a process in which localized pressure is applied from the outside along the perimeter of the region to be peeled to apply damage to a part of the inside or the surface of the second material layer. Specifically, a diamond or other such hard needle may be pressed perpendicularly and moved while applying pressure. Preferably, a scriber device is used and is pressed down by an amount of 0.1 mm to 2 mm, with pressure being applied as it is moved. In this way, before performing the peeling, it is important to create a portion where peeling can occur easily, which serves as a starter. By performing the preprocessing in which the selective (partial) reduction of the adhesion takes place, defective peelings are eliminated and yield is improved.

Subsequently, a FPC 901 is attached to a terminal electrode provided at the end of an outgoing wiring to which TFT provided on the layer to be peeled 933 is connected.

Next, a second substrate 935 and the layers to be peeled 933a, 933b are adhered to each other using a first adhesive 934. (See FIG. 11B) A film 902 is adhered to the second substrate 935 with an adhesive 903 in advance. The adhesive 903 is desired to be weaker in adhesive force than that of the first adhesive 934, and it is also desired to be an adhesive which is soluble so as to dissolve in a solvent, or is photosensitive so as to lose adhesiveness when irradiated with light. However, the adhesive 903 is removed in subsequent steps. Further, instead of the first adhesive 934, a tape having adhesive on one or both of its surfaces may be used. The tape may include on one or both of its surfaces an adhesive which is soluble so as to dissolve in a solvent, or is photosensitive so as to lose adhesiveness when irradiated with light.

The first adhesive 934 may be a reactive-curing type adhesive, a thermal-curing type adhesive, an ultraviolet-curing type adhesive or other such photo-curing type adhesive, or may be an aerophobic-type adhesive, or other various types of curing adhesive. The composition of these adhesives may be, for example, epoxy-type, acrylic-type, silicon-type or anything else. However, since a light emitting element in which a layer containing an organic compound serves as a light emitting layer is weak against moisture and oxygen, a material with high barrier to moisture and oxygen is preferable. The application of such adhesives may be carried out by a coating method, for example. In this embodiment, for the first adhesive 934, used is a thermal-curing type adhesive.

The second substrate 935 may be constituted by a glass substrate, a quartz substrate, a ceramic substrate, a plastic substrate or the like. Further, it is also possible to use a semiconductor substrate such as a silicon substrate, or a metallic substrate such as a stainless steel substrate.

The present embodiment employs a highly rigid quartz substrate (thickness: 1.1 mm) for the second substrate 935, having a thickness larger than that of the first substrate 930. In the case where a plastic film is used for the second substrate, when the elements formed onto the first substrate 930 are transferred onto the plastic film—which is to say when the layer to be peeled 933 and the film are adhered to each other by the first adhesive 934 and the film is lifted up—there was a risk that the film will bend and cause cracks to form in the layer to be peeled 933. Therefore, after fixing the layer to be peeled 933 formed over the first substrate 930 to the rigid second substrate 935 with the first adhesive 934, the first substrate 930 is peeled. Then, after the plastic film (i.e., the third substrate 937) is fixed to the layer with the second adhesive 936, the second substrate 935 is removed. By following this procedure, it becomes difficult for cracks to occur.

Next, peeling is performed from the above-mentioned region where the adhesiveness has been reduced, and the first substrate 930 having the first material layer 931 is separated by using a physical means. (See FIG. 11C) Since the second material layer 932 exhibits compressional stress and the first material has tension stress, the separation can be achieved with relatively little force (such as the force of a human hand, or wind pressure of gas blown from a nozzle, or ultrasonic waves, etc.).

It thus becomes possible to separate the layers to be peeled 933a and 933b formed on the second material layer 932 from the first substrate 930.

Figure 11A:
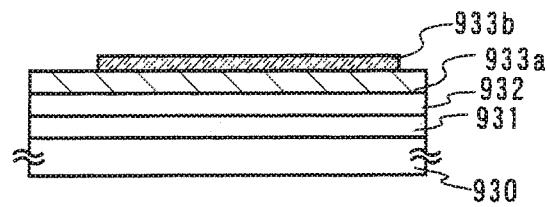
FIGS. 11A to 11F are diagrams of steps illustrating Embodiment 4 of the present invention.
Figure 11B:
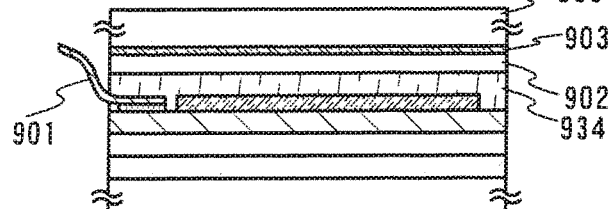
Figure 11C:
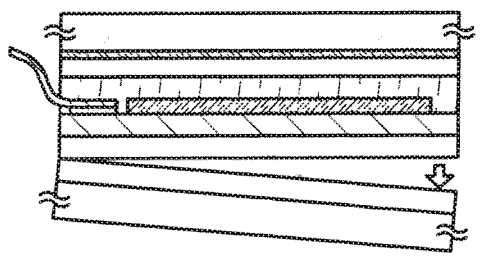
Figure 11D:
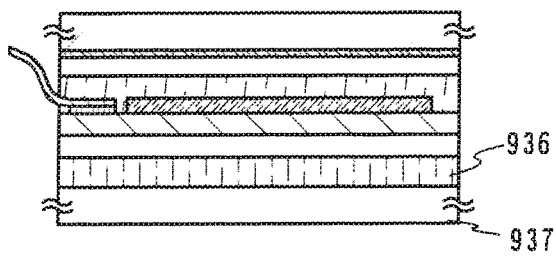

Subsequently, the third substrate 937 and the second material layer 932 (and layers to be peeled 933a, 933b) are bonded together by the second adhesive 936 (FIG. 11D). It is essential that the adhesive 936 has greater adhesive force than that of the adhesive 903.

The second adhesive 936 may be a reactive-curing type adhesive, a thermal-curing type adhesive, an ultraviolet-curing type adhesive or other such photo-curing type adhesive, or may be an aerophobic-type adhesive, or other various types of curing adhesive. In this embodiment, for the second adhesive 936, used is a thermal-curing type adhesive. Further, in the case where the second adhesive 936 is made of a material which is soluble so as to dissolve in a solvent, or is photosensitive such that it loses adhesive strength when exposed to light, it becomes possible to peel the third substrate at a later step, and it is possible for only the film 902, the first adhesive and the second adhesive to serve as the supports.

A flexible substrate can be used for the third substrate 937. In this embodiment, the plastic film used for 902 also is used for the third substrate 937.

Figure 11E:
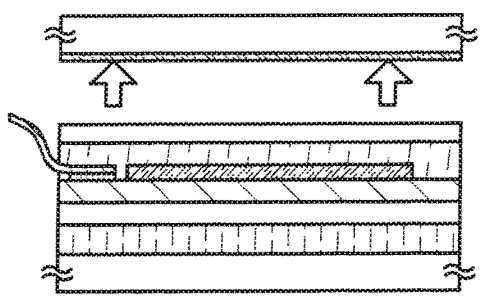

After the state shown in FIG. 11D is obtained, the adhesive 903 is irradiated by ultraviolet so that the adhesive force is weaken, therefore, only the second substrate 935 is separated (FIG. 11E). The second substrate 935 is easily peeled by irradiating ultraviolet, the second substrate 935 and the film 902 are separated thereby.

Figure 11F:
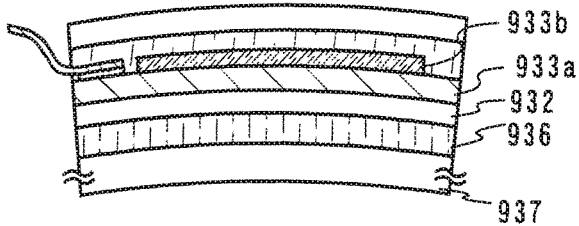

The steps described above enable the manufacture of a semiconductor device equipped with the layers to be peeled 933a, 933b which serves as a support for the second adhesive 936 and the third substrate 937. Then, by curving the device as shown in FIG. 11F, it thus becomes possible to achieve a semiconductor device in which the curved surface of the semiconductor device exhibits a radius of curvature of from 50 cm to 200 cm. When curving the device, it can be attached to the curved surface to which it is going to be mounted. Note that, between the second adhesive 936 and the layer to be peeled 933a, there is the oxide layer 932 that is the second material layer. In the semiconductor device obtained as described above, the second material layer 932 is applied by a sputtering method and minute amounts of inert gas elements are included in the second material layer 932. Therefore, the semiconductor device as a whole can be made flexible.

External views of a bent semiconductor device having a light emitting element in which a layer containing an organic compound serves as a light emitting layer obtained by above steps are shown in FIGS. 12A and 12B.

FIG. 12A and FIG. 12B respond to FIG. 1, the same reference symbols are used for the same portions. A semiconductor shown in FIG. 12A emits light in a direction of an arrow indicated in FIG. 12A, and the device is bent in a bending direction 19. Although not illustrated here, all channel length directions of a large number of semiconductor layers provided on a pixel portion 12 and a driver circuit 17 are aligned with the same direction. In addition, assume that the laser light irradiation direction, that is, a scanning direction is the same direction as the channel length directions. Thus, when the crystal growth direction is aligned with the channel length direction, the field effect mobility can be substantially increased.

Further, a semiconductor device shown in FIG. 12B emits light in an opposite direction to the one shown in FIG. 12A, and the device is bent in a bending direction 19. Note that the emitting direction can be defined at operator's discretion in accordance with manufacturing methods of a light emitting element in which a layer containing an organic compound serves as a light emitting layer and compositions of pixel circuits.

Embodiment 5

The present embodiment illustrates an example in which a display having the curved surface obtained by the technique presented in any one of Embodiments 1 through 4 is mounted in a vehicle. Here, an automobile is used as a representative example of a vehicle, but restriction is not made to an automobile. Rather, it goes without saying that the invention may be applied in an aircraft, a train, an electric train, or the like.

Figure 13:
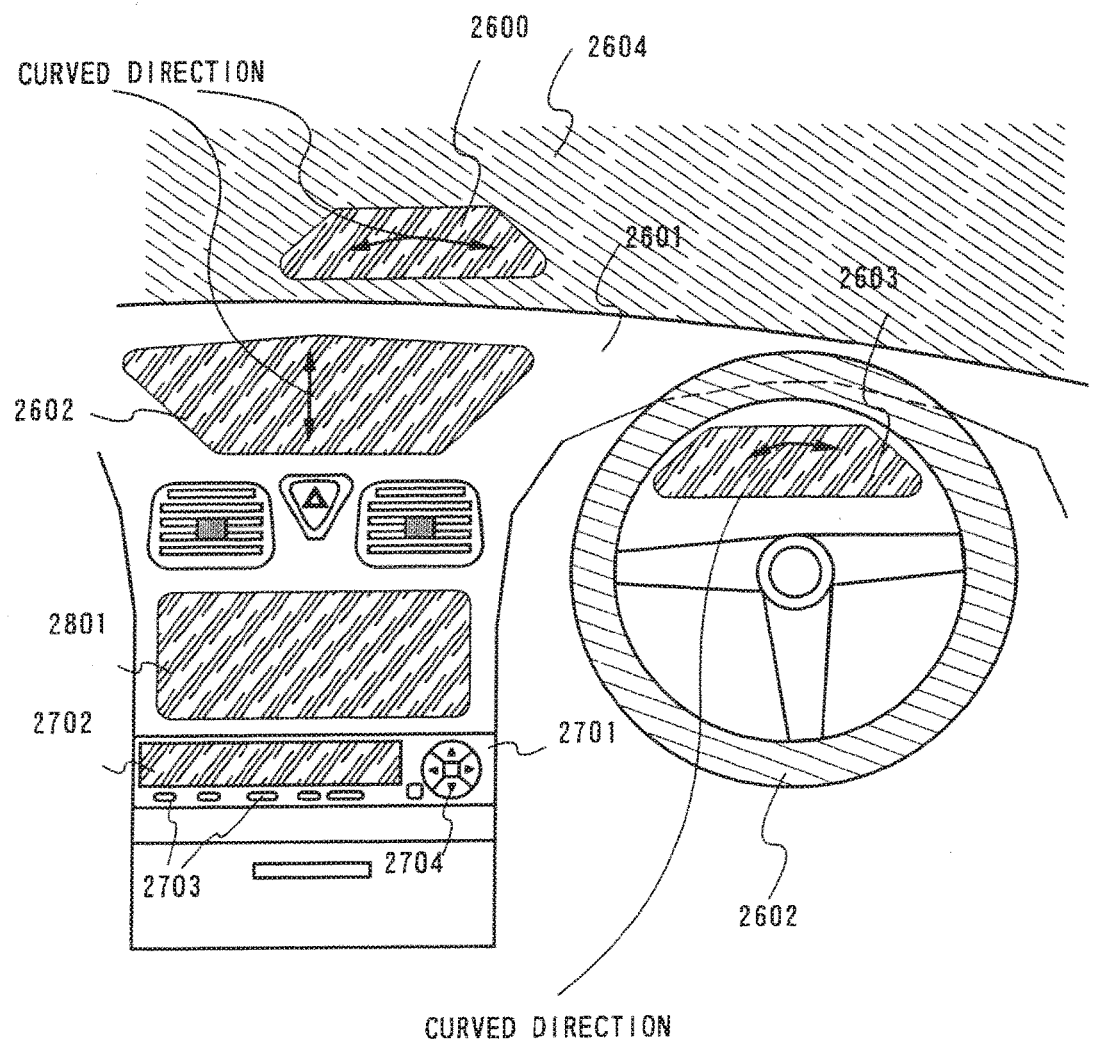
FIG. 13 is a diagram showing the vicinity in front of a driver's seat in a car, according to Embodiment 5 of the present invention.

FIG. 13 is a diagram showing the vicinity around a driver's seat in an automobile. A dashboard portion is provided with sound playback systems, specifically including a car audio system and a navigating system. A main unit 2701 of the car audio system includes a display portion 2702 and operating switches 2703 and 2704. By executing the present invention in the display portion 2702, a thin and lightweight car audio system can be achieved. Further, by executing the present invention in the car navigation system, a thin and lightweight car navigation system can be achieved.

Further, near a steering wheel portion 2602, the dashboard portion 2601 is formed with a display portion 2603 in which digital displays of a speedometer and other such measuring instruments are made. By executing the present invention in the display portion 2702, thin and lightweight mechanical display instruments can be achieved.

Further, it is also possible to form a display portion 2602 attached onto the dashboard 2601 having a curved surface. By executing the present invention in the display portion 2602, a thin and lightweight mechanical display instrument or image display device can be achieved. Note that the display portion 2602 is curved in the direction shown by the arrows.

Further, it is also possible to form a display portion 2600 onto the front windshield 2604 that has a curved surface. In the case where the present invention is adapted for the display portion 2600, a permeable material may be used, so that a thin and lightweight mechanical display instrument or image display device can be achieved by means of the present invention. Note that, the display portion 2600 is curved in the direction shown by the arrows. Here, the display portion 2600 was applied in on the windshield, but it may also be provided to other window glass areas.

Figure 14:
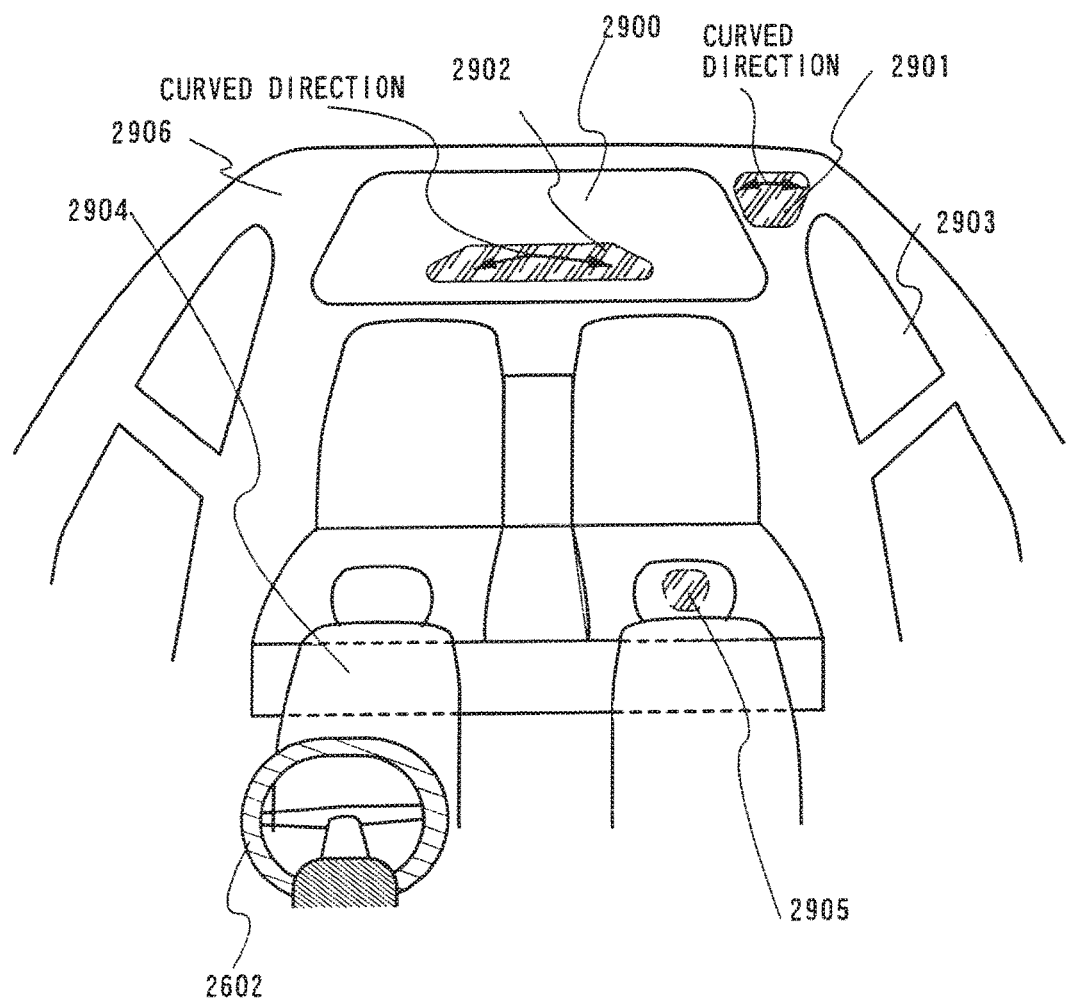
FIG. 14 is a diagram showing the rear portion behind the car, according to Embodiment 5 of the present invention.

It is also possible to form the display portion 2902 attached onto a rear window 2900, for example. FIG. 14 is a diagram showing the vicinity surrounding rear seats in the automobile. Note that, FIG. 14 and FIG. 13 correspond to each other, and since the steering wheel portions are identical, the same reference numerals has been used as in FIG. 13.

Further, by applying a flexible display device according to the present invention onto the rear window 2900 and mounting onto the exterior of the car a camera which can capture the area behind the car, and then by connecting the display device and the camera, the driver can see places which are obstructed by the car and could not be seen otherwise. Note that, the display portion 2902 is curved in the direction shown by the arrows.

Further, if the automobile is driven from the right side as shown in FIG. 14, there is a blind spot on the rear-left side since there is a portion of the vehicle body 2906 there (i.e., the part between windows). However, by applying a flexible display device (display portion 2901) according to the present invention onto the part between the windows and mounting onto the exterior of the car a camera which can capture the blind spot, and by connecting the display device and the camera, the driver can check the blind spot. Note that, the display portion 2901 is curved in the direction shown by the arrows.

Further, it is also possible to provide a display portion 2905 onto a seat 2904. A person sitting in the rear seat can watch television and view the display of the car navigational system.

Further, although it is not shown in the diagrams, the ceiling of the car may serve as a base, and a display device having a light emitting element in which a layer containing an organic compound serves as a light emitting layer is curved along the curved surface of the ceiling and is attached thereto, whereby image display and illumination inside the vehicle can be performed.

As described above, the display having the curved surface according to the present invention can be mounted easily onto any curved surface in the vehicle having a radius of curvature of 50 cm to 200 cm.

Further, the present embodiment illustrated an on-board car audio system and car navigating system, but the present invention may be used on other vehicle display instruments and on free-standing audio and navigational systems.

Further, the present embodiment may be combined freely with any one of Embodiments 1 through 4.

Embodiment 6

In Embodiments 1 through 5, the peeling method utilized the film stress (stress deformation) between the two layers to perform the peeling, but restriction is not made to this method. It is possible to use a method in which a separation layer is formed between the layer to be peeled and the substrate, and an etchant is used to separate the separation layer and the substrate, and also a method in which a layer constituted of a amorphous silicon (or a polysilicon) is provided between the layer to be peeled and the substrate, and a laser light is radiated through the substrate to drive out hydrogen contained in the amorphous silicon, thereby creating gaps so as to make the layer to be peeled and the substrate separate, for example.

Here, FIGS. 15A to 15D show an example in which the amorphous silicon (or the polysilicon) containing a large amount of hydrogen as its separating layer is used and laser light is irradiated onto the separation layer to perform the peeling.

Figure 15A:
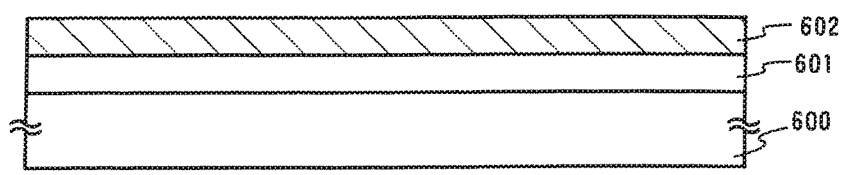
FIGS. 15A to 15D are diagrams of steps illustrating Embodiment 6 of the present invention.
Figure 15B:
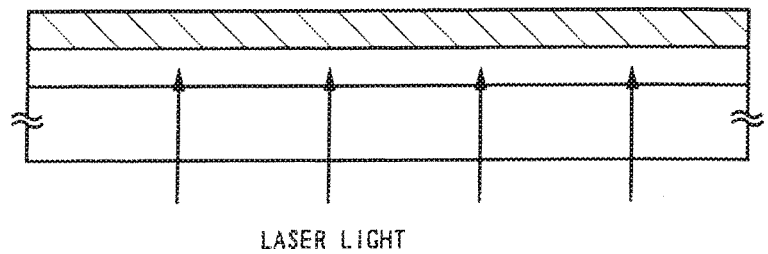

In FIG. 15A, reference numeral 600 indicates a substrate, reference numeral 601 indicates a separation layer, and reference numeral 602 indicates an layer to be peeled.

In FIG. 15A, a translucent substrate such as a glass substrate or a quartz substrate or the like is used for the substrate 600.

Then, the separation layer 601 is formed. Amorphous silicon or polysilicon is used for the separation layer 601. Note that, a sputtering method or a plasma CVD method, or other film application methods may be used as the separation layer 601 so as to put a large amount of hydrogen into it as needed.

Next, the layer to be peeled 602 is formed onto the separation layer 601. (See FIG. 15A). The layer to be peeled 602 may contain various elements, of which a TFT is a typical example (others include thin film diodes, and photoelectric conversion elements and silicon resistant elements made with silicon PIN-junctions). Further, thermal processing may be performed within the temperature range that the substrate 600 can withstand. However, the separation layer 601 is handled in such a way that peeling off of the film and other problems potentially caused by the thermal processing in the manufacturing of the layer to be peeled 602 do not occur. In the case such as the present embodiment where the laser light is used to perform the peeling, in order that the hydrogen does not escape before the peeling is performed, it is desirable that the thermal processing temperature is set at 410° C. or below when forming the elements included in the layer to be peeled.

Next, laser light is irradiated through the substrate 600 onto the separation layer. (See FIG. 15B). For the laser light, it is possible to use an excimer laser or other such gas laser, a YAG laser or other such solid-state laser, or a semiconductor laser. Further, the oscillation of the laser light may be continuous oscillation or pulse oscillation, and the shape of the laser beam may be linear or rectangular. In the present embodiment, the laser radiation device indicated in Embodiment 1 is used. By using the laser radiation device indicated in Embodiment 1, it is possible to radiate the laser beam across the entirety of a large surface area with good throughput. Further, the laser radiation device indicated in Embodiment 1 can be used not only for crystallizing or peeling, but also for performing various laser annealing.

Figure 15C:
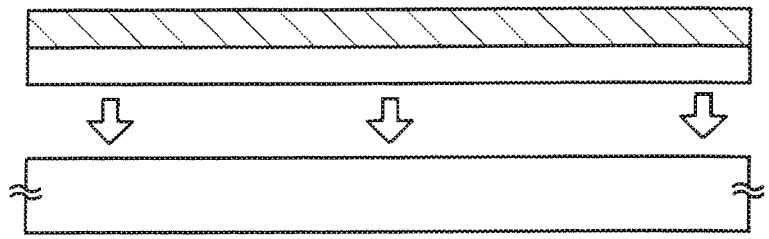

When the above-mentioned laser light causes the release of the hydrogen contained in the separation layer 601, gaps are created and the layer to be peeled 602 and the substrate 600 separate from each other. (FIG. 15C). By using the laser radiation device indicated in Embodiment 1, it becomes possible to peel a layer to be peeled having a large area, across the entire surface thereof with good yield.

Figure 15D:
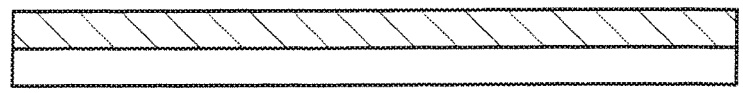

The post-peeling state is shown in FIG. 15D. Further, the example shown here assumes that the mechanical strength of the layer to be peeled 602 is sufficient. However, in the case where the mechanical strength of the layer to be peeled 602 is insufficient, the peeling should be performed after applying a support (not shown in the diagram) for anchoring the layer to be peeled 602.

Further, the peeled layer after peeling can be curved in a certain direction. It also goes without saying that the peeled layer can be applied and transferred onto an object having a curved surface.

In the present embodiment as well, the direction of the laser light radiation (i.e., scan direction) and the directions of the channel length of all the semiconductor layers provided to the layer to be peeled are facing in the same direction, and this direction is made perpendicular to the direction of the curvature. Accordingly, the display having the curved surface can be realized.

Further, the configuration of the present embodiment may be combined freely with Embodiments 1 through 5.

Note that, in the case where the present embodiment is combined with Embodiment 1, the separation layer 601 of the present embodiment may be used instead of the separation layer 409 of Embodiment 1, and the laser may be radiated from the back side to perform the peeling.

Similarly, in the case where the present embodiment is combined with Embodiment 2, the separation layer 601 of the present embodiment may be used instead of the separation layer 509 of Embodiment 2, and the laser may be radiated from the back side to perform the peeling.

According to the present invention, crystallization is performed by radiating a laser beam across the entire surface of a substrate having a broad surface area while directing it at the location of a semiconductor region which forms the TFTs, whereby a crystalline semiconductor layer having a large grain size can be formed and also improvement of the TFT characteristics is attained to realize a display having a curved surface.

According to the present invention, a display having a curved surface is realized. Thus, in the case where an imaging or measuring display is to be furnished in a limited space such as at the driver's seat in an automobile or aircraft or other such vehicle, the display can be mounted to various locations that have curved surfaces (such as the window, the ceiling, the door, the dashboard, etc.), thereby reducing the space occupied by the display.

What is claimed is:

1. A method for manufacturing a semiconductor device comprising a transistor, the transistor comprising a semiconductor layer, a source electrode, and a drain electrode, the method comprising:
    forming a separation layer over a substrate;
    forming a peeled layer comprising the transistor over the separation layer; and
    irradiating the separation layer with a laser light to separate the peeled layer from the substrate,
    wherein the peeled layer is capable of curving in a first direction,
    wherein a scan direction of the laser light and a direction of a channel length of the transistor which is a direction from one of the source electrode and the drain electrode to the other of the source electrode and the drain electrode are each a second direction, and
    wherein the first direction is perpendicular to the second direction.

2. The method according to claim 1, wherein the separation layer is formed of an amorphous silicon or a polysilicon.

3. The method according to claim 1, wherein the separation layer is formed by a sputtering method or a plasma CVD method so as to put a large amount of hydrogen into the separation layer.

4. The method according to claim 1, wherein the substrate is a glass substrate or a quartz substrate.

5. The method according to claim 1, wherein elements included in the peeled layer are formed at 410° C. or below.

6. The method according to claim 1, wherein a shape of the laser light is linear or rectangular.

7. The method according to claim 1, wherein the laser light is irradiated to a back surface of the separation layer through the substrate.

8. A method for manufacturing a semiconductor device comprising a transistor, the transistor comprising a semiconductor layer, a source electrode, and a drain electrode, the method comprising:
    forming a separation layer over a substrate;
    forming a peeled layer comprising the transistor over the separation layer;
    irradiating the separation layer with a laser light to separate the peeled layer from the substrate; and
    transferring the peeled layer to an object,
    wherein the peeled layer is capable of curving in a first direction,
    wherein a scan direction of the laser light and a direction of a channel length of the transistor which is a direction from one of the source electrode and the drain electrode to the other of the source electrode and the drain electrode are each a second direction, and
    wherein the first direction is perpendicular to the second direction.

9. The method according to claim 8, wherein the separation layer is formed of an amorphous silicon or a polysilicon.

10. The method according to claim 8, wherein the separation layer is formed by a sputtering method or a plasma CVD method so as to put a large amount of hydrogen into the separation layer.

11. The method according to claim 8, wherein the substrate is a glass substrate or a quartz substrate.

12. The method according to claim 8, wherein elements included in the peeled layer are formed at 410° C. or below.

13. The method according to claim 8, wherein a shape of the laser light is linear or rectangular.

14. The method according to claim 8, wherein the laser light is irradiated to a back surface of the separation layer through the substrate.

15. The method according to claim 8, wherein the object has a curved surface.

* * * * *